(12) United States Patent
Toda et al.

(10) Patent No.: US 12,191,316 B2
(45) Date of Patent: Jan. 7, 2025

(54) SEMICONDUCTOR DEVICE

(71) Applicant: Japan Display Inc., Tokyo (JP)

(72) Inventors: Tatsuya Toda, Tokyo (JP); Toshinari Sasaki, Tokyo (JP); Masayoshi Fuchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/439,855

(22) Filed: Feb. 13, 2024

(65) Prior Publication Data
US 2024/0258331 A1 Aug. 1, 2024

Related U.S. Application Data

(63) Continuation of application No. 17/031,999, filed on Sep. 25, 2020, now Pat. No. 11,935,898, which is a
(Continued)

(30) Foreign Application Priority Data

Mar. 30, 2018 (JP) .................. 2018-067326

(51) Int. Cl.
*H01L 27/12* (2006.01)
*G02F 1/1362* (2006.01)
(Continued)

(52) U.S. Cl.
CPC ...... *H01L 27/124* (2013.01); *G02F 1/136227* (2013.01); *G02F 1/136286* (2013.01);
(Continued)

(58) Field of Classification Search
None
See application file for complete search history.

(56) References Cited

U.S. PATENT DOCUMENTS 11,610,998 B2* 3/2023 Sato .................. H01L 29/78651
11,824,063 B2* 11/2023 Hanada ............... H01L 21/8234
(Continued)

FOREIGN PATENT DOCUMENTS

JP   2015073092 A   4/2015
JP   2016178299 A   10/2016
(Continued)

OTHER PUBLICATIONS

International Search Report issued May 21, 2019 in PCT/JP2019/007661 filed on Feb. 27, 2019, citing documents USPUB Nos. 2-4 & FP Nos. 2-4 therein, 1 page.
(Continued)

*Primary Examiner* — Bo B Jang
(74) *Attorney, Agent, or Firm* — Maier & Maier, PLLC

(57) ABSTRACT

A semiconductor device including: a first gate electrode; a first gate insulating layer on the first gate electrode; a first oxide semiconductor layer on the first insulating layer; source and drain electrodes connected to the first oxide semiconductor layer; a second gate insulating layer on the first oxide semiconductor layer; a second oxide semiconductor layer on the second gate insulating layer; a second gate electrode on the second oxide semiconductor layer, the second gate electrode being in contact with the second oxide semiconductor layer; a first insulating layer on the second gate electrode, the first insulating layer having a part of a first aperture overlapping with the second oxide semiconductor layer in a planar view; and a first connecting electrode electrically connecting the first gate electrode and the second gate electrode via the first aperture.

5 Claims, 23 Drawing Sheets

Related U.S. Application Data continuation of application No. PCT/JP2019/007661, filed on Feb. 27, 2019.

(51) Int. Cl.
  *G02F 1/1368* (2006.01)
  *G09G 3/3225* (2016.01)
  *G09G 3/3266* (2016.01)
  *H10K 59/12* (2023.01)
  *H10K 59/123* (2023.01)
  *H10K 59/124* (2023.01)
  *H10K 59/131* (2023.01)

(52) U.S. Cl.
  CPC ......... *G02F 1/1368* (2013.01); *G09G 3/3225* (2013.01); *G09G 3/3266* (2013.01); *H01L 27/1259* (2013.01); *H10K 59/123* (2023.02); *H10K 59/124* (2023.02); *H10K 59/131* (2023.02); *G02F 1/136295* (2021.01); *G09G 2300/0861* (2013.01); *H01L 27/1225* (2013.01); *H01L 27/1255* (2013.01); *H10K 59/1201* (2023.02)

(56) References Cited

U.S. PATENT DOCUMENTS

| | | |
|---|---|---|
| 2010/0025675 A1 | 2/2010 | Yamazaki et al. |
| 2013/0334533 A1 | 12/2013 | Yamazaki |
| 2014/0004656 A1 | 1/2014 | Sasagawa et al. |
| 2015/0060848 A1 | 3/2015 | Sasagawa et al. |
| 2016/0276486 A1 | 9/2016 | Koezuka et al. |
| 2016/0343866 A1 | 11/2016 | Koezuka et al. |
| 2017/0025544 A1 | 1/2017 | Yamazaki et al. |

FOREIGN PATENT DOCUMENTS

| | | |
|---|---|---|
| JP | 2017028252 A | 2/2017 |
| JP | 2017028288 A | 2/2017 |

OTHER PUBLICATIONS

Office Action issued Apr. 12, 2022, in corresponding Japanese Patent Application No. 2018-067326 (English Translation only), 3 pages.

\* cited by examiner

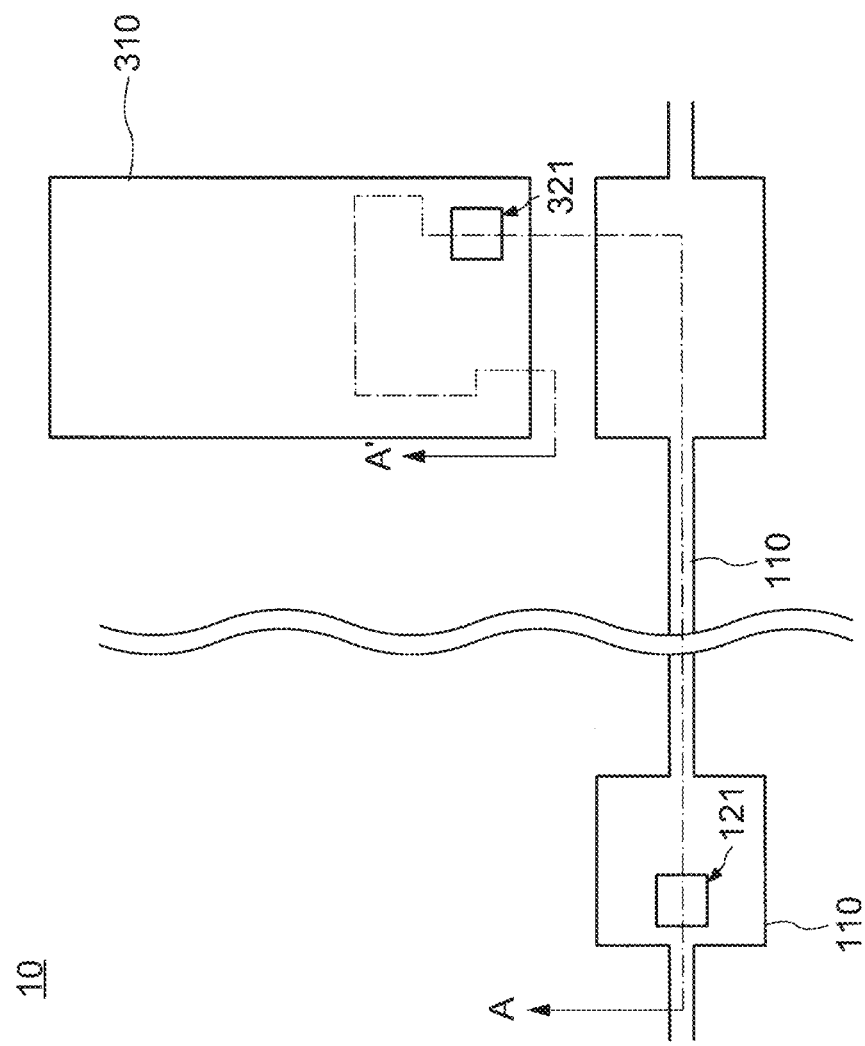

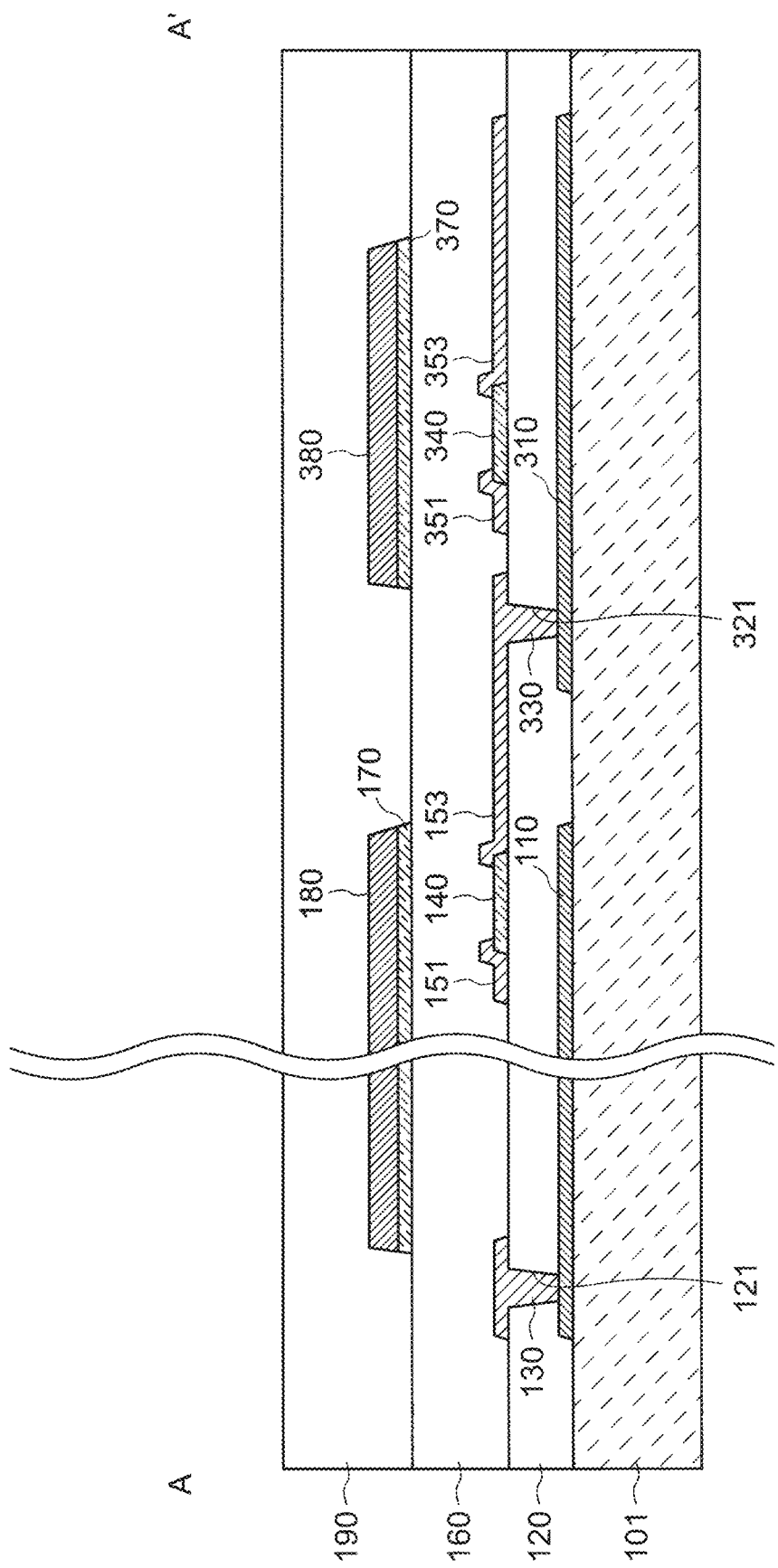

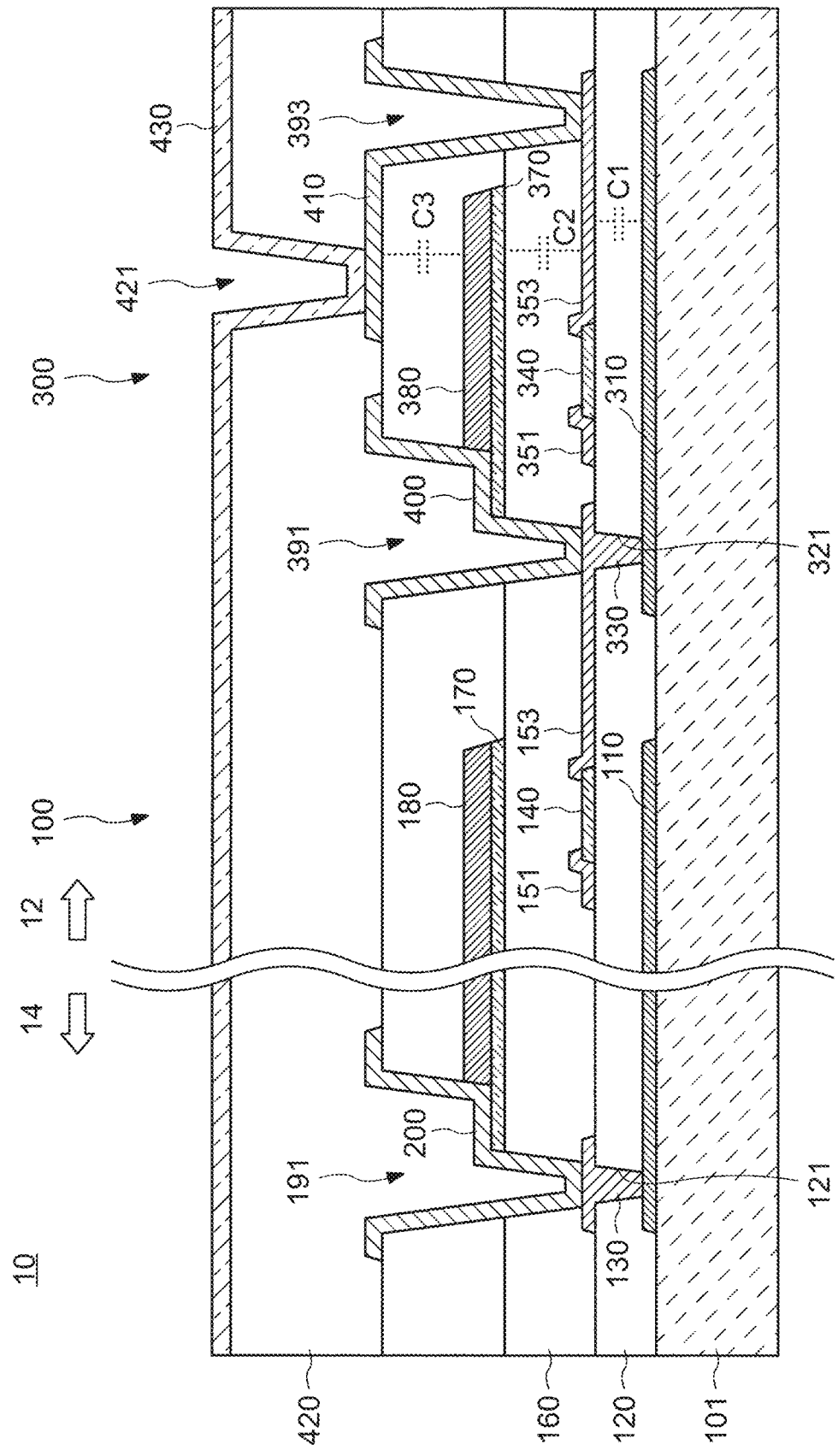

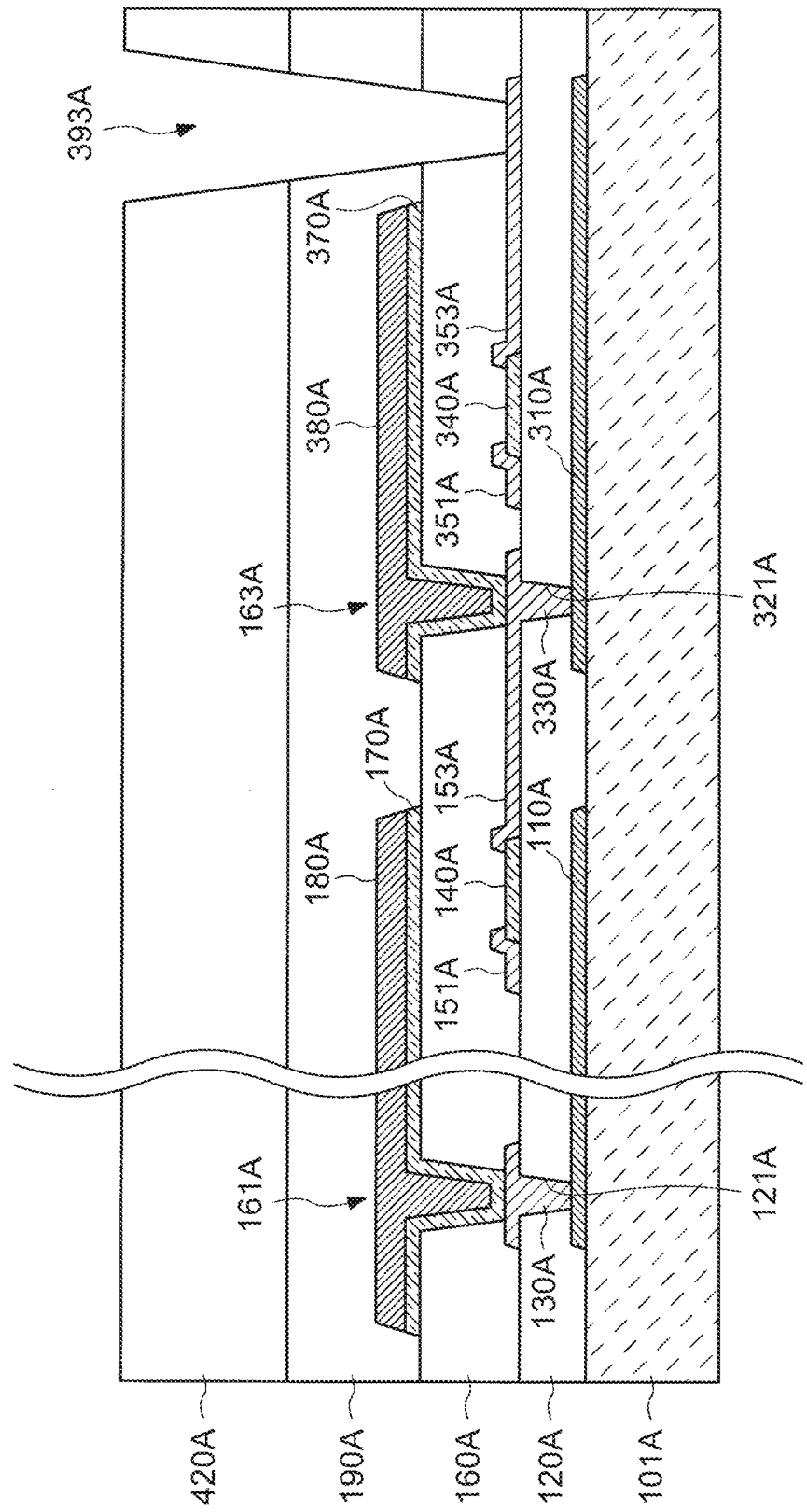

SEMICONDUCTOR DEVICE

CROSS REFERENCE TO RELATED APPLICATIONS

This application is a Continuation of U.S. patent application Ser. No. 17/031,999, filed on Sep. 25, 2020, which is a U.S. continuation application filed under 35 U.S.C. § 111(a), of International Application No. PCT/JP2019/007661, filed on Feb. 27, 2019, which claims priority to Japanese Patent Application No. 2018-067326 filed on Mar. 30, 2018, the disclosures of each of which are incorporated by reference.

FIELD

The present invention relates to a semiconductor device and a display device. In particular, the present invention relates to the semiconductor device and the display device in which an oxide semiconductor layer is used as a semiconductor layer.

BACKGROUND

Recently, a semiconductor device using an oxide semiconductor as a channel is developed instead of an amorphous silicon, a low-temperature polysilicon, and a single-crystal silicon. The semiconductor device using the oxide semiconductor as the channel is known to be able to form the semiconductor device in a simple structure with low-temperature process similar to the semiconductor device using the amorphous silicon as the channel, and to have a higher mobility than the semiconductor device using the amorphous silicon as the channel. The semiconductor device using the oxide semiconductor as a channel is known to have a very low off current.

For example, when the oxide semiconductor is used as a semiconductor layer of a bottom gate type transistor, the oxide semiconductor layer on a side opposite to a bottom gate electrode side (in other words back channel side) with respect to the oxide semiconductor layer is exposed to a surface during a manufacturing process such as an etching process. As a result, defects tend to occur on the back channel side of the oxide semiconductor layer. The accumulation of fixed charges in this fault may cause a transistor operation variations.

In the bottom gate transistor, in order to suppress the effect of defects or the like formed on the back channel side of the oxide semiconductor layer, for example, in Japanese laid-open patent publication No. 2015-073092, the back gate electrode is arranged via an insulating layer above the oxide semiconductor layer. Thus, a technique stabilizing characteristics of transistor has been proposed by arranging the back gate electrode above the oxide semiconductor layer.

However, when the back gate electrode is arranged, individual wiring and circuit are required to control the bottom gate electrode and the back gate electrode. Alternatively, a structure in which the bottom gate electrode and the back gate electrode are connected is required. For example, as in Japanese laid-open patent publication No. 2015-073092, when the bottom gate electrode and the back gate electrode are connected, it is required to arrange a contact structure for connecting both to a region that differs from the back gate electrode. In such a case, a region is required to arrange the contact structure separately from a region where the transistor is arranged, thus interferes with miniaturization of the circuit in which the transistor is used.

Alternatively, for example, Japanese laid-open patent publication No. 2015-073092, a conductive layer which is the same layer as a source electrode and a drain electrode, and a conductive layer which is the same layer as the gate electrode to form a capacity element. Since a size of the capacity element is determined by an area of the electrodes which constitute the capacity element, in order to form a capacity element required for a pixel circuit, an area corresponding to the required capacitance must be secured. Thus, such capacity element may interfere with the miniaturization of the pixel circuit.

SUMMARY

A semiconductor device according to an embodiment of the present invention including: a first gate electrode; a first gate insulating layer on the first gate electrode; a first oxide semiconductor layer on the first insulating layer; source and drain electrodes connected to the first oxide semiconductor layer; a second gate insulating layer on the first oxide semiconductor layer; a second oxide semiconductor layer on the second gate insulating layer; a second gate electrode on the second oxide semiconductor layer, the second gate electrode being in contact with the second oxide semiconductor layer; a first insulating layer on the second gate electrode, the first insulating layer having a part of a first aperture is overlapping with the second oxide semiconductor layer in a planar view; and a first connecting electrode electrically connecting the first gate electrode and the second gate electrode via the first aperture.

A semiconductor device according to an embodiment of the present invention including: a first gate electrode; a first gate insulating layer on the first gate electrode; a first oxide semiconductor layer on the first insulating layer; source and drain electrodes connected to the first oxide semiconductor layer; a second gate insulating layer on the first oxide semiconductor layer; a second oxide semiconductor layer on the second gate insulating layer; a second gate electrode on the second oxide semiconductor layer, the second gate electrode being in contact with the second oxide semiconductor layer; and a connecting electrode electrically connecting the first gate electrode and the second gate electrode. The second gate insulating layer has a first aperture. The second oxide semiconductor layer and the second gate electrode are arranged in the first aperture. The second gate electrode is electrically connected to the first gate electrode via the second oxide semiconductor layer.

A display device according to an embodiment of the present invention including: a first gate electrode; a first gate insulating layer on the first gate electrode; a first oxide semiconductor layer on the first insulating layer; source and drain electrodes connected to the first oxide semiconductor layer; a second gate insulating layer on the first oxide semiconductor layer, the second gate insulating layer having a part of a third aperture; a second oxide semiconductor layer on the second gate insulating layer; a second gate electrode on the second oxide semiconductor layer, the second gate electrode being in contact with the second oxide semiconductor layer; a first insulating layer on the second gate electrode, the first insulating layer having a part of the third aperture; a third connecting electrode on the first insulating layer, the third connecting electrode being connected to one of the source and drain electrodes via the third aperture; a second insulating layer on the third connecting electrode, the second insulating layer having a fourth aperture; and a pixel electrode on the second insulating layer, the pixel electrode being connected to the third connecting electrode via the fourth aperture. The first gate electrode and the one of the source and drain electrodes are overlapping with each other in a planar view. The one of the source and drain electrodes and the second gate electrode are overlapping with each other in a planar view. The second gate electrode and the third connecting electrode are overlapping with each other in a planar view.

BRIEF DESCRIPTION OF DRAWINGS

FIG. 3B is a planar view illustrating a method for manufacturing a display device according to an embodiment of the present invention;

FIG. 6 is a cross-sectional view illustrating a method for manufacturing a display device according to an embodiment of the present invention;

FIG. 9 is a cross-sectional view illustrating an outline of a display device according to an embodiment of the present invention;

FIG. 17 is a cross-sectional view showing a method for manufacturing a display device according to an embodiment of the present invention.

DESCRIPTION OF EMBODIMENTS

Figure 1A:
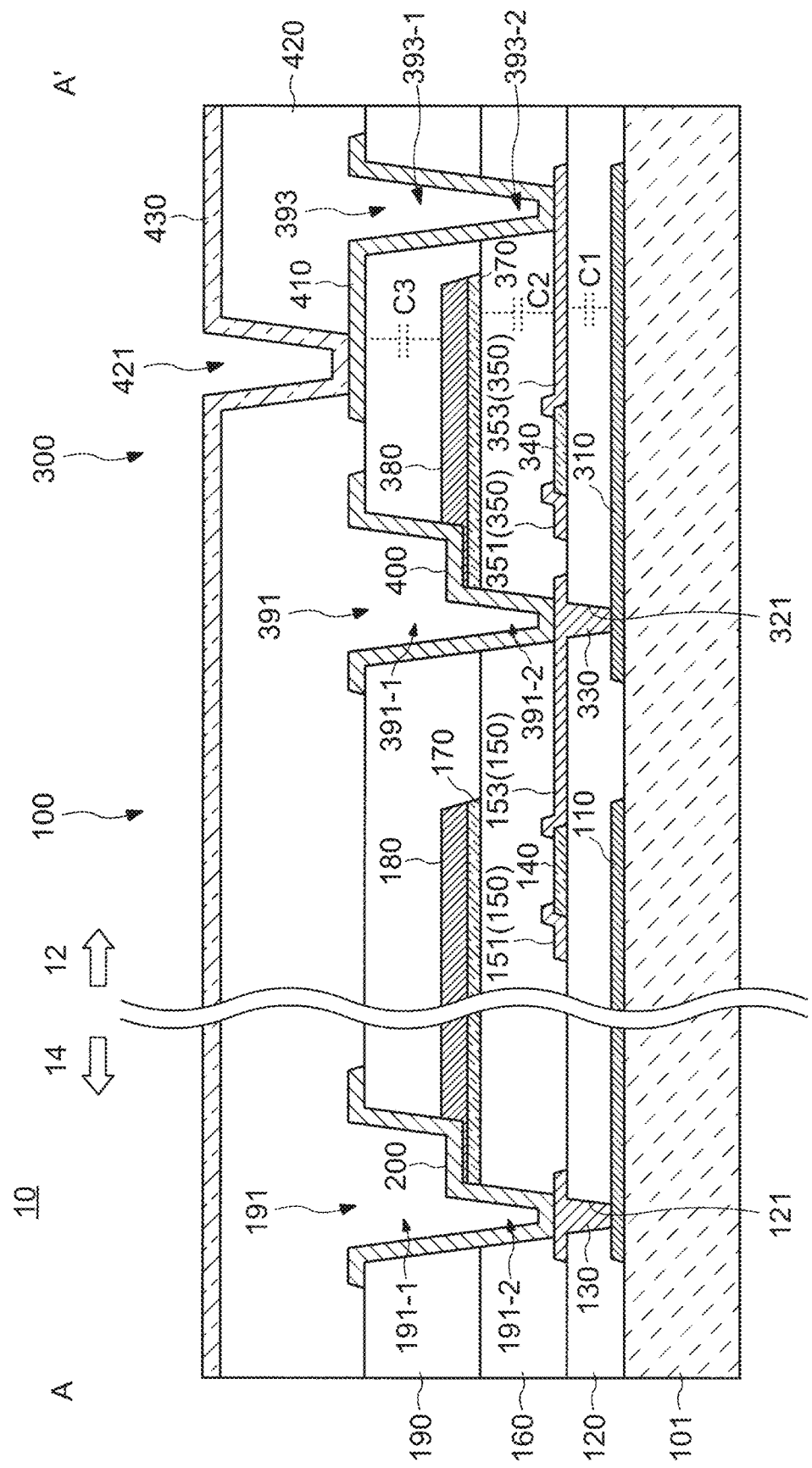
FIG. 1A is a cross-sectional view illustrating an outline of a display device according to an embodiment of the present invention.

An embodiments of the present invention will be described below with reference to the drawings. The invention is merely an example, and configurations that can be easily conceived by a person skilled in the art by appropriately changing the subject matter of the invention are naturally included in the scope of the invention. To clarify, the drawings may be represented schematically in terms of the width, thickness, shape, and the like of each part compared with actual embodiments, but the drawings are merely examples and do not limit the interpretation of the present invention. In this specification and each drawing, elements similar to those described above with reference to the preceding drawings are denoted by the same reference numerals, followed by an alphabet, and a detailed description thereof may be omitted as appropriate.

In an embodiment of the present invention, the direction from a substrate in which a transistor is arranged toward the transistor is referred to as on, over, upper or above. Conversely, the direction from the transistor to the substrate is called under, lower or below. As described above, although the description is made using the phrase above or below for convenience of description, for example, the vertical relation between the substrate and the transistor may be reversed from that shown in the drawing. In the following description, for example, the expression "the transistor above the substrate" only explains the vertical relationship between the substrate and the transistor as described above, other member may be disposed between the substrate and the transistor.

"Display device" refers to a construction that displays an image using an electro-optic layer. For example, the term a display device may refer to a display panel including the electro-optic layer, or it may refer to a construction in which other optical member (e.g., a polarized member, a backlight, a touch panel, etc.) are attached to a display cell. As used herein, the "electro-optic layer" may include a liquid crystal layer, an electroluminescent (EL) layer, an electrochromic (EC) layer, and an electrophoretic layer, as long as there is no technical contradiction. Therefore, the embodiment described later will be described by exemplifying an organic EL display device including an organic EL layer as a display device, but the application to the display device including the other electro-optical layers described above is not excluded.

The expressions "a includes A, B or C", "a includes any of A, B and C", "a includes one selected from a group consisting of A, B and C", do not exclude the case where a includes a plurality of combinations of A to C unless otherwise specified. Furthermore, these expressions do not exclude the case where a includes other elements.

The following embodiments can be combined with each other as long as there is no technical contradiction.

An embodiment of the present invention intends to provide a semiconductor device and a display device capable of realizing miniaturization of a transistor circuit.

First Embodiment

[Construction of Display Device]

Referring to FIG. 1A to FIG. 9, an outline of a display device 10 according to an embodiment of the present invention will be described. The display device is a display device using a bottom gate transistor in which an oxide semiconductor is used as a channel is used as a transistor in a pixel circuit. The display device 10 may be a liquid crystal display device (LCD), a self light emitting display device in which a self light emitting element such as an organic EL element (Organic Light-Emitting Diode: OLED) or quantum dots are used for a display unit, or a reflective display device such as an electronic paper or a like. The bottom gate transistor is used for each pixel or driving circuit of each display device.

In this embodiment, although the display device 10 will be described, a first transistor 100 and a second transistor 300 used in the display device 10 can be applied to a semiconductor device other than the display device. For example, a transistor used in the display device 10 may be used in an integrated circuit (IC) such as a micro-processing unit (MPU).

[Construction of Display Device 10]

In the following embodiment, the pixel circuit of the organic EL display device will be described as an example of the display device 10. That is, a configuration in which the organic EL layer is used as an electro-optic layer of the display device will be described.

Figure 1B:
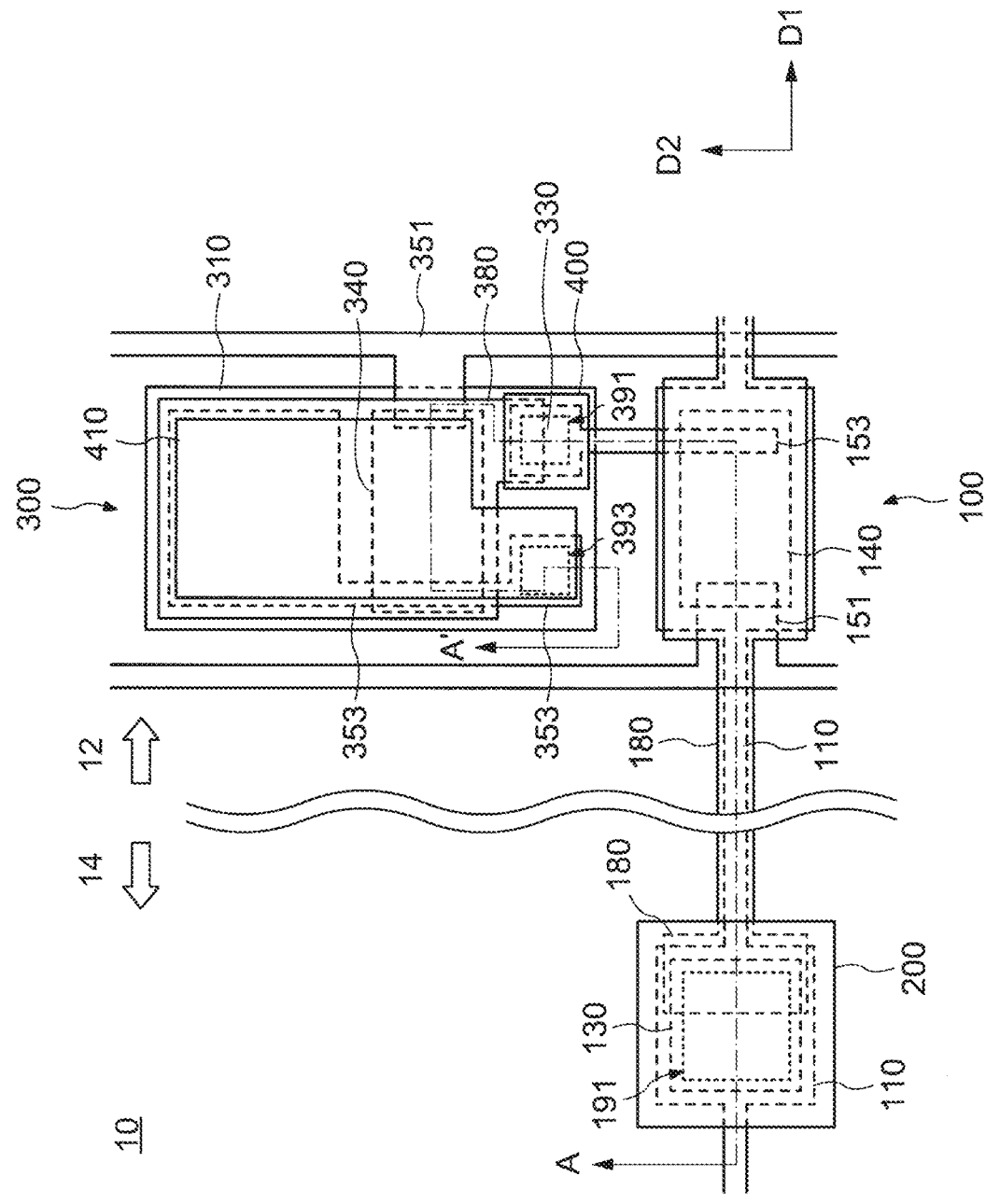
FIG. 1B is a planar view illustrating an outline of a display device according to an embodiment of the present invention.

FIG. 1A is a cross-sectional view illustrating an outline of a display device according to an embodiment of the present invention. FIG. 1B is a planar view illustrating an outline of a display device according to an embodiment of the present invention. The cross-sectional view of FIG. 1A is a cross-sectional view of a line A to A' in the planar view of FIG. 1B. In FIG. 1B, a second insulating layer 420 and a pixel electrode 430 are omitted. As shown in FIG. 1A and FIG. 1B, the display device 10 has a first transistor 100 and a second transistor 300. The first transistor 100 and the second transistor 300 are arranged in a display region 12 in which a plurality of pixels is disposed. A first aperture 191 and a first connection electrode 200 to be described later is arranged in a peripheral region 14 around the display region 12. In this embodiment, the first transistor 100 corresponds to a pixel circuit selecting transistor, the second transistor 300 corresponds to a driver transistor. The first transistor 100 is connected to the second transistor 300. Specifically, a drain electrode 153 of the first transistor 100 to be described later is connected to a bottom gate electrode (a first gate electrode 310) and a back gate electrode (a second gate electrode 380) of the second transistor 300. The first transistor 100 and the second transistor 300 are both arranged on a substrate 101.

The first transistor 100 has a first gate electrode 110, a first gate insulating layer 120, a first oxide semiconductor layer 140, a source electrode 151, a drain electrode 153, a second gate insulating layer 160, a second oxide semiconductor layer 170, and a second gate electrode 180. The first gate insulating layer 120 is arranged on the first gate electrode 110. The first oxide semiconductor layer 140, the source electrode 151, and the drain electrode 153 are arranged on the first gate insulating layer 120. The second gate insulating layer 160 is arranged on the first oxide semiconductor layer 140. The second oxide semiconductor layer 170 is arranged on the second gate insulating layer 160. The second gate electrode 180 is arranged on the second oxide semiconductor layer 170 so as to contact the second oxide semiconductor layer 170.

The source electrode 151 and the drain electrode 153 are in contact with the first oxide semiconductor layer 140 from above the first oxide semiconductor layer 140. That is, the first transistor 100 is a top contact structure. However, the source electrode 151 and the drain electrode 153 may be in contact with the first oxide semiconductor layer 140 from below the first oxide semiconductor layer 140. That is, the first transistor 100 may be a bottom contact structure.

Figure 4A:
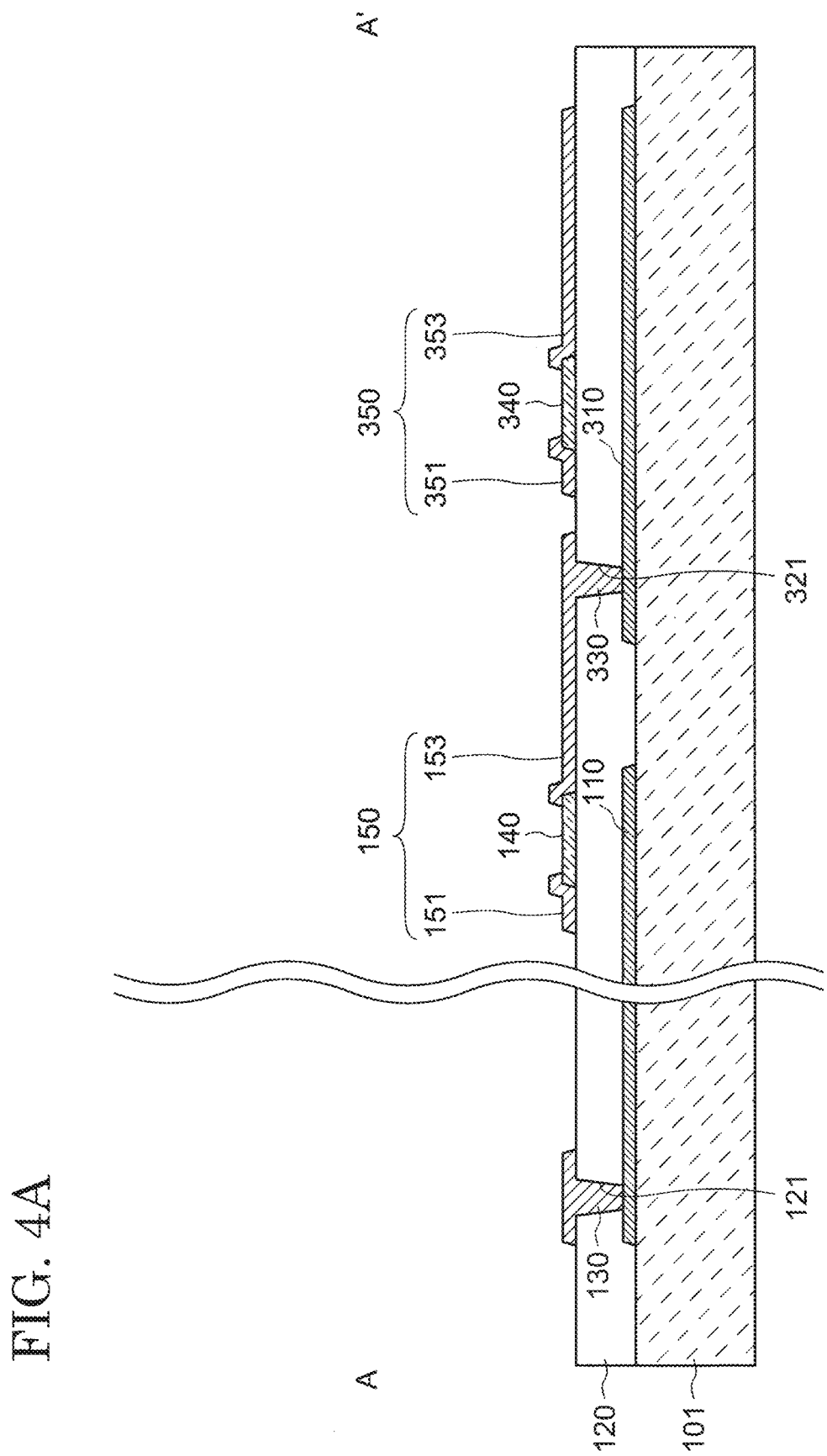
FIG. 4A is a cross-sectional view illustrating a process for manufacturing a display device according to an embodiment of the present invention.

In the case where the source electrode 151 and the drain electrode 153 are not particularly distinguished, these electrodes may simply be referred to as an SD electrode 150 (refer FIG. 4A). Incidentally, as in a pixel selecting transistor of a liquid crystal display, even when the SD electrode 150 switches operations of a source electrode function and a drain electrode function, for convenience of explanation, the electrode connected to a signal line is referred to as the source electrode 151, and the electrode connected to a pixel electrode is referred to as the drain electrode 153.

The display device 10 has a first insulating layer 190 on the first transistor 100 (which means on the second gate electrode 180). The first aperture 191 is arranged in the second gate insulating layer 160 and the first insulating layer 190. As described above, the first aperture 191 is arranged in the peripheral region 14. For convenience of explanation, a part of a region corresponding to the first insulating layer 190 among the first aperture 191 may be referred to as a first region 191-1. A part of a region corresponding to the second gate insulating layer 160 among the first aperture 191 may be referred to as a second region 191-2. As shown in FIG. 1B, the first aperture 191 is overlapping with the second oxide semiconductor layer 170, the second gate electrode 180, and a second connection electrode 130 to be described later in a planar view. That is, the first aperture 191 reaches the second gate electrode 180 and the second connection electrode 130. In other words, the second gate electrode 180 and the second connection electrode 130 are exposed from the second gate insulating layer 160 and the first insulating layer 190 by one aperture (the first aperture 191). The first aperture 191 is also formed in a part of the second gate electrode 180. The second gate electrode 180 in a region corresponding to the first aperture 191 is thinned when the first aperture 191 is formed. That is, the film thickness of the second gate electrode 180 in a region corresponding to the first aperture 191 is smaller than a film thickness of the second gate electrode 180 of the other region.

Although described in detail later, when the first aperture 191 is formed, there are cases when the second gate electrode 180 in a region corresponding to the first aperture 191 is all etched in the film thickness direction. In such cases, the first aperture 191 reaches the second oxide semiconductor layer 170. That is, the second oxide semiconductor layer 170 and the second connection electrode 130 are exposed from the first insulating layer 190 and the second gate electrode 180 by one aperture (the first aperture 191). In this case, the first aperture 191 overlaps with the second oxide semiconductor layer 170 and the second connection electrode 130 to be described later in a planar view.

A first connection electrode 200 is arranged on the first insulating layer 190 and the first aperture 191. The first connection electrode 200 electrically connects the second gate electrode 180 and the first gate electrode 110 via a first aperture 191. In FIG. 1A, the first connection electrode 200 is in contact with an upper surface of second gate electrode 180 which is thinned, a side of the second oxide semiconductor layer 170, and an upper surface of the second connection electrode 130 in the first aperture 191. As described above, in the case where the second gate electrode 180 in a region corresponding to the first aperture 191 is all etched in its thickness direction, the first connection electrode 200 is in contact with the upper surface of the second oxide semiconductor layer 170, the side surface of the second oxide semiconductor layer 170, and the upper surface of the second connection electrode 130.

A second aperture 121 is arranged in the first gate insulating layer 120. The second aperture 121 overlaps with the first gate electrode 110 in a planar view (refer FIG. 3B to be described later). That is, the second aperture 121 reaches the first gate electrode 110. The second connection electrode 130 is arranged on the first gate insulating layer 120 and the second aperture 121. The second connection electrode 130 is connected to the first gate electrode 110 via a second aperture 121 to electrically connect the first gate electrode 110 and the first connection electrode 200. The second connection electrode 130 is formed on the same layer as the SD electrode 150.

The second transistor 300 has a first gate electrode 310, a first gate insulating layer 120, a first oxide semiconductor layer 340, a source electrode 351, a drain electrode 353, a second gate insulating layer 160, a second oxide semiconductor layer 370, and a second gate electrode 380. The source electrode 351 and the drain electrode 353 are in contact with the first oxide semiconductor layer 340 from above the first oxide semiconductor layer 340. In the case where the source electrode 351 and the drain electrode 353 are not particularly distinguished, these electrodes may simply be referred to as a SD electrode 350.

The first gate electrode 310 is arranged in the same layer as the first gate electrode 110. The first oxide semiconductor layer 340 is arranged in the same layer as the first oxide semiconductor layer 140. The SD electrode 350 is arranged in the same layer as the SD electrode 150. The second oxide semiconductor layer 370 is arranged in the same layer as the second oxide semiconductor layer 170. The second gate electrode 380 is arranged in the same layer as the second gate electrode 180.

Similar to the first transistor 100, a first aperture 391 is arranged on the second gate insulating layer 160 and in the first insulating layer 190. For convenience of explanation, a part of a region corresponding to the first insulating layer 190 among the first aperture 391 may be referred to as a first region 391-1. A part of a region corresponding to the second gate insulating layer 160 among the first aperture 391 may be referred to as a second region 391-2. As shown in FIG. 1B, the first aperture 391 overlaps with the second oxide semiconductor layer 370, the second gate electrode 380, and a second connection electrode 330 in a planar view. A first connection electrode 400 is arranged in the first aperture 391. A second aperture 321 is arranged in the first gate insulating layer 120. The second connection electrode 330 is arranged in the second aperture 321. That is, the first connection electrode 400 is connected to the second connection electrode 330 via the first aperture 391. The structures of the first aperture 391, the first connection electrode 400, the second aperture 321, and the second connection electrode 330 are the same as the structures of the first aperture 191, the first connection electrode 200, the second aperture 121, and the second connection electrode 130 of the first transistor 100, the description thereof will be omitted. As described above, the first transistor 100 and the second transistor 300 have common features. For common features, there may be a case when the configuration of one transistor is described, and the description of the configuration of the other transistor be omitted. For example, in the following description, the features described for the first gate electrode 110 are also common to the first gate electrode 310.

As shown in FIG. 1A, a third aperture 393 is arranged on the second gate insulating layer 160 and in the first insulating layer 190. For convenience of explanation, a part of a region corresponding to the first insulating layer 190 among the third aperture 393 may be referred to as a first region 393-1. A part of a region corresponding to the second gate insulating layer 160 among the third aperture 393 may be referred to as a second region 393-2. As shown in FIG. 1B, the third aperture 393 overlaps with the drain electrode 353 in a planar view. That is, the third aperture 393 reaches the drain electrode 353. In other words, the drain electrode 353 is exposed from the second gate insulating layer 160 and the first insulating layer 190 by a third aperture 393. The third connection electrode 410 is arranged on the first insulating layer 190 and in the third aperture 393. The third connection electrode 410 is connected to the drain electrode 353 via a third aperture 393.

A second insulating layer 420 is arranged on the first connection electrode 200, 400, and third connection electrode 410. A fourth aperture 421 is arranged in the second insulating layer 420. The fourth aperture 421 reaches the third connection electrode 410. That is, the third connection electrode 410 is exposed from the second insulating layer 420 by the fourth aperture 421. A pixel electrode 430 is arranged on the second insulating layer 420 and in the fourth aperture 421. The pixel electrode 430 is connected to the third connection electrode 410 via a fourth aperture 421. Although it is not shown in figures, an organic EL layer is arranged on the pixel electrode 430, a common electrode (a cathode electrode) is arranged on the organic EL layer. In FIG. 1B, the fourth aperture 421 and the pixel electrode 430 are omitted.

On the drain electrode 353 side of the second transistor 300, capacitances are constituted by three different insulating layers. The first gate electrode 310 and the drain electrode 353 constitute a first capacitance C1 having the first gate insulating layer 120 as a dielectric. The drain electrode 353 and the second gate electrode 380 (or, the second gate electrode 380 and the second oxide semiconductor layer 370) constitute a second capacitance C2 having the second gate insulating layer 160 as a dielectric. The second gate electrode 380 and the third connection electrode 410 constitute a third capacitance C3 having the first insulating layer 190 as a dielectric. That is, as shown in FIG. 1B, in a planar view, the first gate electrode 310 and the drain electrode 353 overlap. Similarly, the drain electrode 353 and the second gate electrode 380 overlap. Similarly, the second gate electrode 380 and the third connection electrode 410 overlap. In other words, the first capacitance C1, the second capacitance C2, and the third capacitance C3 overlap in a planar view.

As shown in FIG. 1B, the first gate electrode 110 and the second gate electrode 180 extend in a first direction D1 (row direction). On the other hand, the source electrode 151 and the source electrode 351 extend in a second direction (column direction). That is, each of the layer in which electrode is arranged uses as a row or column extending wiring. In the present embodiment, since the first connection electrode 200 connects the first gate electrode 110 and the second gate electrode 180 in the peripheral region 14, it is possible to reduce an area of the pixel circuit. However, the first connection electrode 200 may be arranged in the display region 12.

[Material of Member Configuring Display Device 10]

A metal-oxide having the characteristics of semiconductors is used as the first oxide semiconductor layer 140 and a second oxide semiconductor layer 170. For example, an oxide semiconductor containing indium (In), gallium (Ga), zinc (Zn), and oxygen (O) may be used as the oxide semiconductor layer (140, 170). In particular, oxide semiconductor having a composition ratio of In:Ga:Zn:O=1:1:1:4 may be used as the oxide semiconductor layer (140, 170) mentioned above. However, the oxide semiconductor containing In, Ga, Zn, and O used in an embodiment of the present invention is not limited to the above composition, and the oxide semiconductor having a composition other than the above composition may be used. For example, in order to improve the mobility, the oxide semiconductor having a larger In ratio than the ratio mentioned above may be used as the oxide semiconductor layer (140, 170) mentioned above. In order to reduce the effect of irradiating light on the ratio mentioned above, the oxide semiconductor having a large Ga ratio may be used as the oxide semiconductor layer (140, 170) mentioned above so as to increase the band gap.

In the present embodiment, a physical property of an oxide semiconductor used in the first oxide semiconductor layer 140 differ from a physical property of an oxide semiconductor used in the second oxide semiconductor layer 170. For example, the first oxide semiconductor layer 140 is an amorphous and the second oxide semiconductor layer 170 has a crystalline. Alternatively, when both the first oxide semiconductor layer 140 and the second oxide semiconductor layer 170 exhibit crystalline, the second oxide semiconductor layer 170 has a higher crystalline than the first oxide semiconductor layer 140. Here, a high crystallizability means, for example, the height of peaks exhibiting a certain crystallizability is relatively high in XRD (X-Ray Diffraction) patterns obtained by analyzing X-ray diffraction. Alternatively, when there are no significant differences in the height of peaks indicating the crystallizability of the first oxide semiconductor layer 140 and the second oxide semiconductor layer 170, a half-value width of the second oxide semiconductor layer 170 is smaller than a half-value width of the first oxide semiconductor layer 140 in the half-vale width of the peaks in the XRD-analysis. Alternatively, in a pattern or concentric circle shaped pattern of diffracted spots obtained by analyzing ED (Electron Diffraction), a pattern of the second oxide semiconductor layer 170 is clearer than a pattern of the first oxide semiconductor layer 140. Alternatively, an oxygen content of the second oxide semiconductor layer 170 is greater than the oxygen content of the first oxide semiconductor layer 140. Alternatively, the second oxide semiconductor layer 170 has smaller wet etching rate for the same etchant than the first oxide semiconductor layer 140. Alternatively, the second oxide semiconductor layer 170 has a refractive index, a band gap, a film density, and an internal stresses greater than the first oxide semiconductor layer 140.

The first oxide semiconductor layer 140 and the second oxide semiconductor layer 170 may be an amorphous or a crystalline. Both or one of the first oxide semiconductor layer 140 and the second oxide semiconductor layer 170 may be a mixed phase of the amorphous and the crystalline. The first oxide semiconductor layer 140 and the second oxide semiconductor layer 170 are formed by physical vapor deposition method (PVD).

A material in which other elements are added to the oxide semiconductor containing In, Ga, Zn and O may be used as the first oxide semiconductor layer 140 and the second oxide semiconductor layer 170. For example, a metallic element such as Al or Sn may be added to the oxide semiconductor mentioned above. In addition to the above oxide semiconductor, zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$) or the like may be used as the first oxide semiconductor layer 140 and the second oxide semiconductor layer 170.

The first oxide semiconductor layer 140 and the second oxide semiconductor layer 170 may be the oxide semiconductor having the same composition and different composition ratios. Alternatively, the first oxide semiconductor layer 140 and the second oxide semiconductor layer 170 may have different compositions.

A substrate having a light transmittance with respect to visible light is used as a substrate 101. A rigid substrate having no flexibility or a flexible substrate having flexibility is used as the substrate 101. A glass substrate, a quartz substrate, and a sapphire substrate may be used as the rigid substrate. A polyimide substrate, an acrylic substrate, a siloxane substrate, and a fluororesin substrate may be used as the flexible substrate. A non-translucent substrate may be used as the substrate 101. A semiconductor substrate such as a silicon substrate, a silicon carbide substrate, and a compound semiconductor substrate may be used as the substrate 101. A conductive substrate such as a stainless substrate may be used as the substrate 101.

Silicon oxide ($SiO_x$), silicon oxynitride ($SiO_xN_y$), silicon nitride oxide ($SiN_xO_y$), silicon nitride ($SiN_x$), aluminum oxide ($AlO_x$), aluminum oxynitride ($AlO_xN_y$), aluminum nitride oxide ($AlN_xO_y$), aluminum nitride ($AlN_x$), or the like is used (x, y are any positive values) as the first gate insulating layer 120, the second gate insulating layer 160, the first insulating layer 190, and the second insulating layer 420. A construction in which described above are a stacked layer may be used as the insulating layer. A TEOS layer or an organic insulating material layer may be used in addition to the inorganic insulating material layer as the insulating layer.

$SiO_xN_y$ and $AlO_xN_y$ are silicon composites and aluminum composites containing less nitrogen (N) than oxygen (O). $SiN_xO_y$ and $AlN_xO_y$ are silicon composites and aluminum composites containing less oxygen than nitrogen.

The insulating layer mentioned above may be formed by a PVD method or a chemical vapor deposition method (CVD method). As the PVD method, a sputtering method, a vacuum evaporation method, an electron beam evaporation method, and a molecular beam epitaxy method are used. As the CVD method, a thermal CVD method, a plasma CVD method, a catalytic CVD method (Cat-CVD method, a hot wire CVD method), or the like is used. The TEOS layer refers to a CVD layer using TEOS (Tetra Ethyl Ortho Silicate) as a raw material.

As an organic insulating material, a polyimide resin, an acrylic resin, an epoxy resin, a silicone resin, a fluororesin, a siloxane resin or the like is used. The insulating layer may be a single layer or may be a stacked layer of the materials described above. For example, the insulating layer may be a stacked layer of the inorganic insulating material and the organic insulating material mentioned above.

The common metallic materials or conductive metal oxides are used as the first gate electrode 110, the SD electrode 150, the second gate electrode 180, the first connection electrode 200, the second connection electrode 130, and the third connection electrode 410. For example, aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like are used as these electrodes. As the electrode mentioned above, an alloy of the materials mentioned above may be used, or a nitride of the materials mentioned above may be used. The electrodes may be a single layer or may be a stacked layer of a material selected from the materials described above.

A conductive oxide semiconductor such as indium tin oxide (ITO), indium gallium oxide (IGO), indium zinc oxide (IZO), zinc oxide doped with gallium (GZO) or the like is used as the pixel electrode 430. The pixel electrode 430 may be a single layer or may be a stacked layer of the materials described above. When using the conductive layer of the same layer as the third connection electrode 410 as the common electrode, the first connection electrode 200, the second connection electrode 130, and the third connection electrode 410 as the conductive oxide semiconductor mentioned above may be used.

[Circuit Configuration of Display Device 10]

Figure 2:
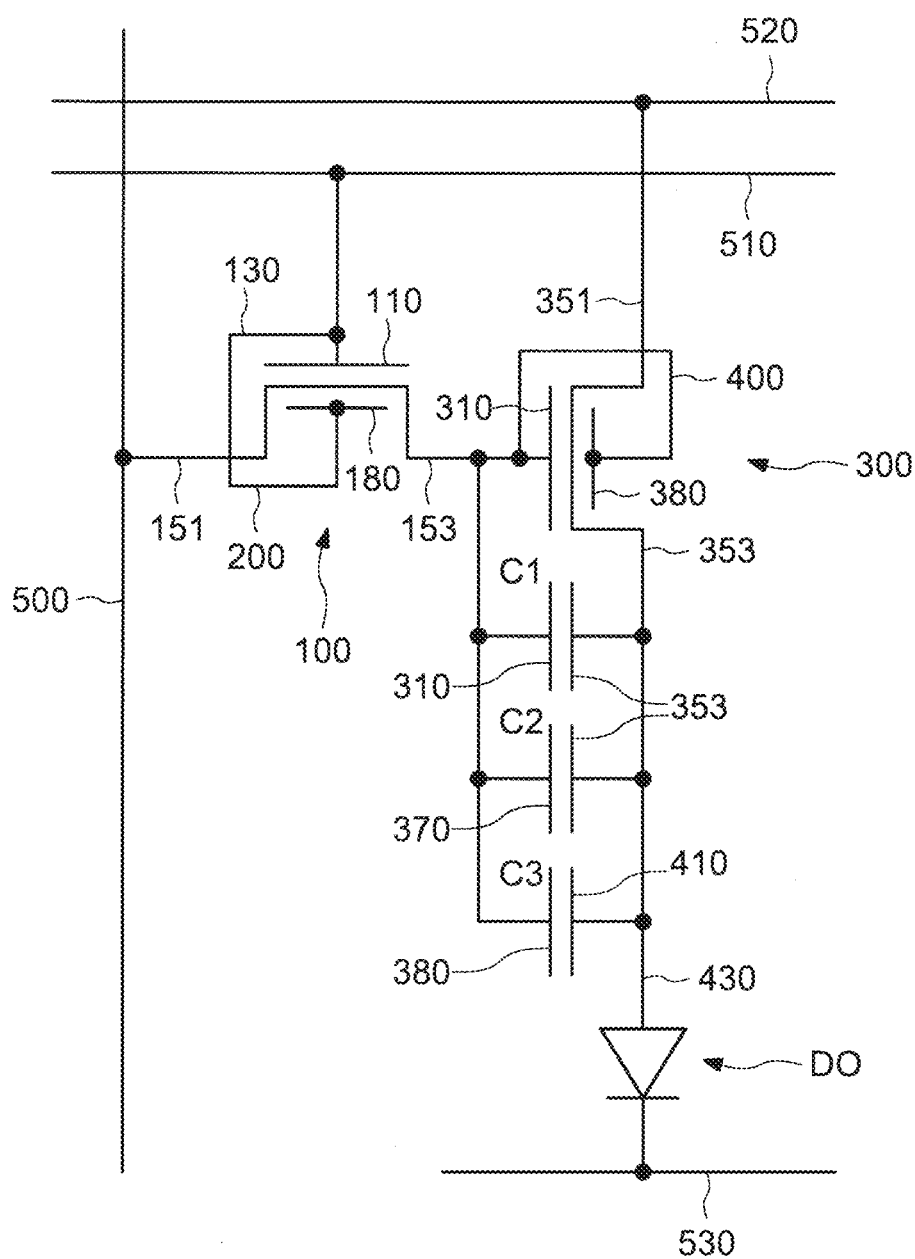
FIG. 2 is a pixel diagram illustrating an outline of a display device according to an embodiment of the present invention.

FIG. 2 is a pixel diagram illustrating an outline of a display device according to an embodiment of the present invention. As shown in FIG. 2, in the display device 10, the first transistor 100 is a pixel selecting transistor, and the second transistor 300 is a driver transistor. The first transistor 100 is connected to a signal line 500 and a gate line 510. The second transistor 300 is connected to an anode power line 520 and a light emitting element DO. As described above, the first transistor 100 is connected to the second transistor 300.

The source electrode 151 is connected to the signal line 500. The drain electrode 153 is connected to the first gate electrode 310 of the second transistor 300. The first gate electrode 110 is connected to the gate line 510. The second gate electrode 180 is connected to the first gate electrode 110 via the first connection electrode 200 and the second connection electrode 130.

The source electrode 351 is connected to the anode power supply line 520. The drain electrode 353 functions as one of the electrodes of the first capacitance C1 and the second capacitance C2. Further, the drain electrode 353 is connected to the third connection electrode 410 which is one of the electrode of the third capacitance C3 and the pixel electrode 430 which is an anode electrode of the light emitting element DO. The first gate electrode 310 functions as the other electrode of the first capacitance C1. The first gate electrode 310 is connected to the second oxide semiconductor layer 370 and the second gate electrode 380, respectively. The second oxide semiconductor layer 370 and the second gate electrode 380 are the other electrode of the second capacitance C2, and the other electrode of the third capacitance C3. The common electrode which is a cathode electrode of the light emitting element DO (not shown) is connected to a cathode power supply line 530. As described above, the first capacitance C1, the second capacitance C2, and the third capacitance C3 function as storage capacitance in the pixel circuit of the organic EL display device.

In the above embodiment, as shown in FIG. 1A, the configuration for connecting the first connection electrode 200 and the first gate electrode 110 via the second connection electrode 130 has been exemplified, but the embodiment is not limited to this configuration. For example, the first aperture 191 may be formed in the first gate insulating layer 120, the second gate insulating layer 160, the first insulating layer 190, and the first connection electrode 200 and the first gate electrode 110 may be in direct contact without arranging the second connection electrode 130.

A conductive layer which is the same layer as the first connection electrodes 200, 400, and the third connection electrode 410 may be used to configure wiring. According to the present embodiment, by adjusting the forming location of another aperture formed in the same process as the first aperture 191, it is possible to select an object to which the other aperture is exposed. That is, by the aperture formed in the same process as the first aperture 191, it is possible to expose either a conductive layer arranged in the same layer as the first gate electrode 110, a conductive layer arranged in the same layer as the second gate electrode 180, or a conductive layer arranged in the same layer as the SD electrode 150. Thus, the signal line 500 or the gate line 510 can be formed in the same layer of the conductive layer as the first connection electrodes 200, 400, and the third connection electrode 410.

In the above explanation, the configuration in which the organic EL layer is used as the electro-optical layer of the display device has been described, but not limited to this configuration. The liquid crystal layer may be used as the electro-optic layer. For example, if the liquid crystal layer driven in an IPS (In-Plane Switching) method is used as the electro-optic layer in which orientation of the liquid crystal is controlled by a horizontal electric field, the pixel electrode 430 has a comb-like patterned shape at a planar view. In this case, the common electrode is arranged on the same layer as the third connection electrode 410. With this configuration, the horizontal electric field is formed between the third connection electrode 410 and the pixel electrode 430. In this situation, the liquid crystal layer is arranged on the pixel electrode 430 via an orientation film. On the other hand the liquid crystal layer driven in a VA (Vertical Alignment) method is used as the electro-optic layer in which orientation of the liquid crystal is controlled by a vertical electric field, the common electrode is arranged on the counter substrate opposed to the substrate 101. With this configuration, the vertical electric field is formed between the pixel electrode 430 and the common electrode. In this case, the liquid crystal layer is arranged between the pixel electrode 430 and the common electrode via the orientation film, respectively.

As described above, in the display device 10 according to this embodiment, the second gate electrode 180 is exposed from the first insulating layer 190 by one aperture (first aperture 191), the second connection electrode 130 is exposed from the second gate insulating layer 160. Then, the second gate electrode 180 and the second connection electrode 130 are connected inside the first aperture 191 by the first connection electrode 200. In this configuration, as compared with the case of arranging an aperture reaching the second gate electrode 180 and an aperture reaching the second connection electrode 130 individually, since there is no need to arrange a space between the respective apertures, it is possible to miniaturize the transistor circuit. Alternatively, since it is possible to increase the diameter of the first aperture 191, it is possible to reduce an aspect ratio of an aperture (ratio of an aperture depth to the aperture diameter). By the aspect ratio of the aperture is reduced, it is possible to improve a coverage of the first connection electrode 200 in the first aperture 191. That is, it is possible to form the first connection electrode 200 on a side wall of the first insulating layer 190 in the first aperture 191 with a sufficient film thickness. As a result, it is possible to suppress a defect such as disconnection in the side wall.

Further, it is possible to reduce a size of area which capacitances are disposed because the first capacitance C1, the second capacitance C2 and the third capacitance C3 overlap in a planar view. As a result, it is possible to miniaturize the transistor circuit.

[Method for Manufacturing the Display Device 10]

A manufacturing process of the display device 10 according to the present embodiment will be described with reference to FIG. 3A to FIG. 8. FIG. 3A to FIG. 8 are a cross-sectional view and a plan view, illustrating a method for manufacturing the display device respectively, according to an embodiment of the present invention.

Figure 3A:
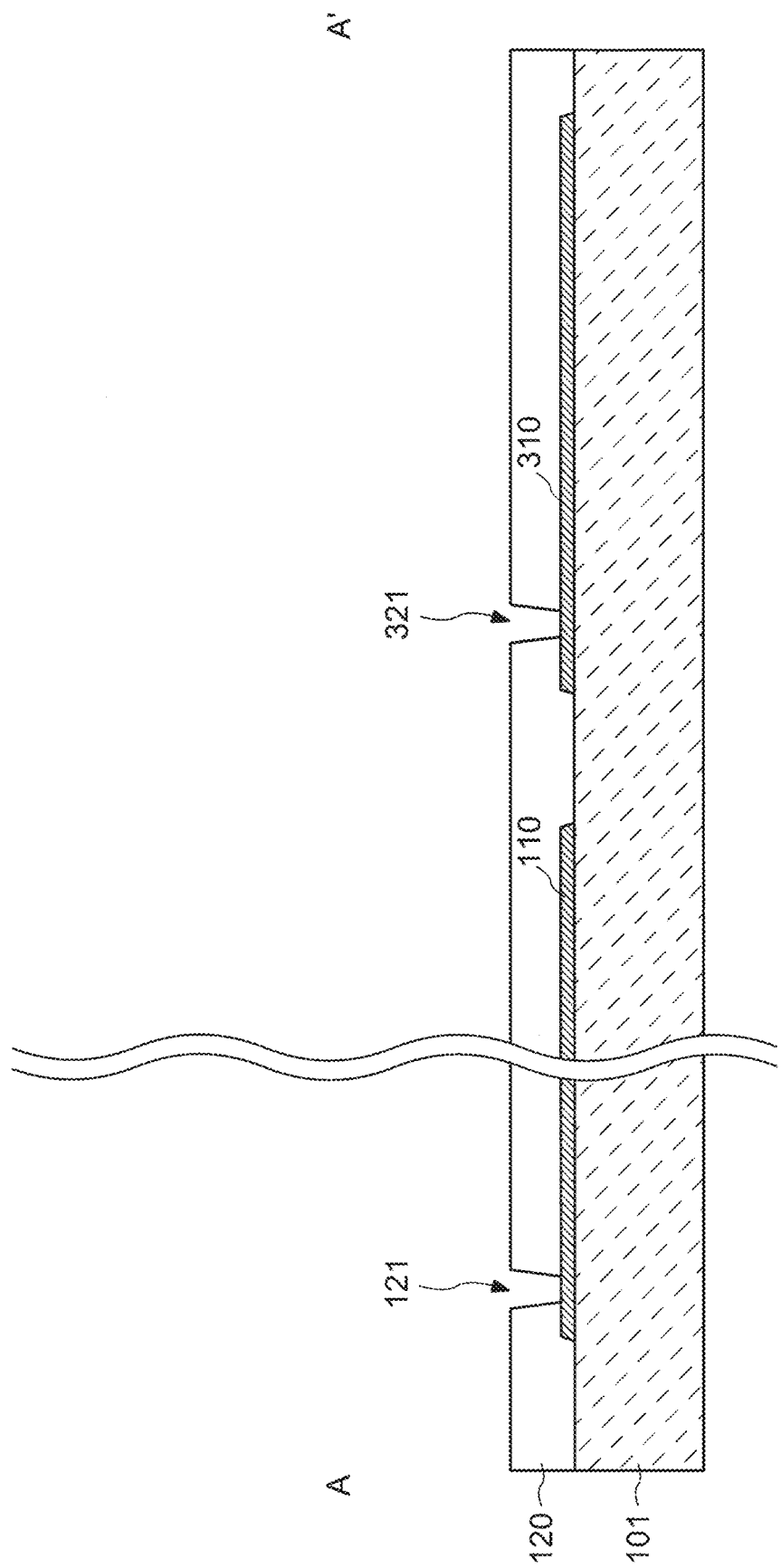
FIG. 3A is a cross-sectional view illustrating a method for manufacturing a display device according to an embodiment of the present invention.

First, as shown in FIG. 3A and FIG. 3B, the first gate electrodes 110, 310 are formed on the substrate 101, and then the first gate insulating layer 120 is formed thereon. Then, the second apertures 121, 321 are formed in the first gate insulating layer 120, and the first gate electrodes 110, 310 are exposed.

Figure 4B:
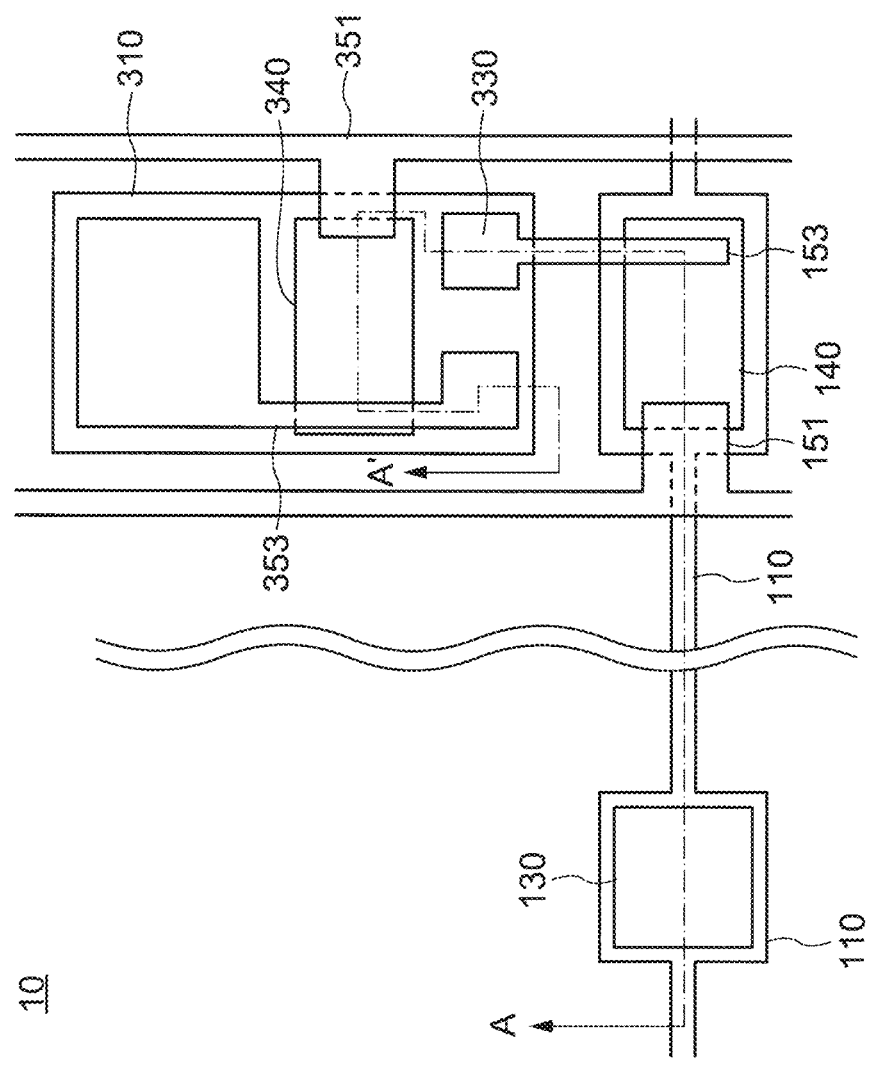
FIG. 4B is a planar view illustrating a method for manufacturing a display device according to an embodiment of the present invention.

Subsequently, as shown in FIG. 4A and FIG. 4B, a pattern of the first oxide semiconductor layers 140, 340 are formed on the first gate insulating layer 120. A conductive layer is formed on the first oxide semiconductor layers 140, 340, and the second connection electrodes 130, 330 and the SD electrodes 150, 350 are formed by patterning the conductive layer. Here, a film deposition of an oxide semiconductor layer to be the first oxide semiconductor layers 140, 340 (hereinafter, referred to as "film deposition of the first oxide semiconductor layers 140, 340") is performed under certain condition achieving these oxide semiconductor to be satisfy a proper physical properties as a channel of the transistor. For example, these first oxide semiconductor layers 140, 340 are formed under a condition achieving these oxide semiconductor to be amorphous. However, the first oxide semiconductor layers 140, 340 may be formed under a condition achieving these oxide semiconductor to be crystalline.

Figure 5A:
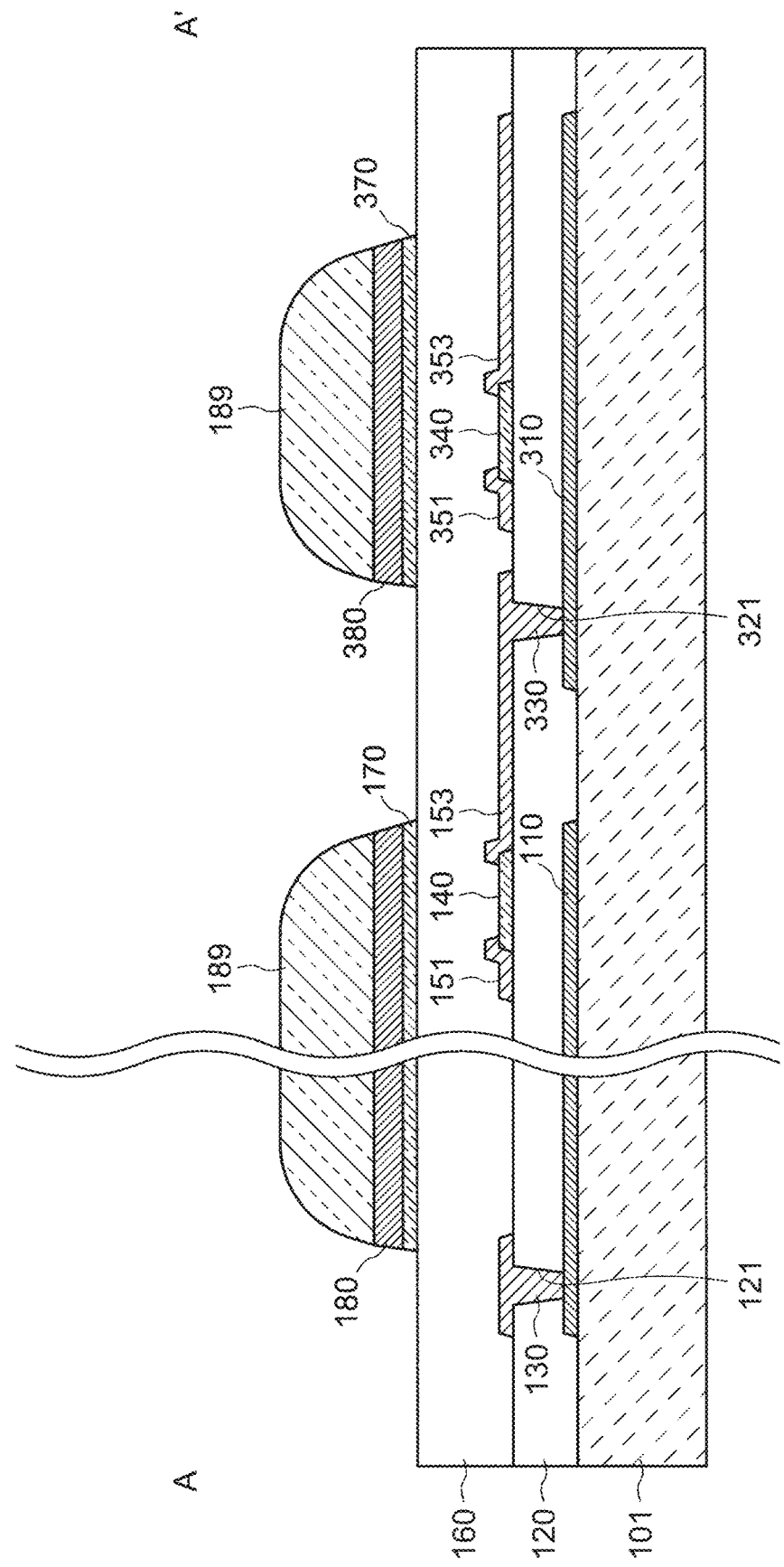
FIG. 5A is a cross-sectional view illustrating a method for manufacturing a display device according to an embodiment of the present invention.
Figure 5B:
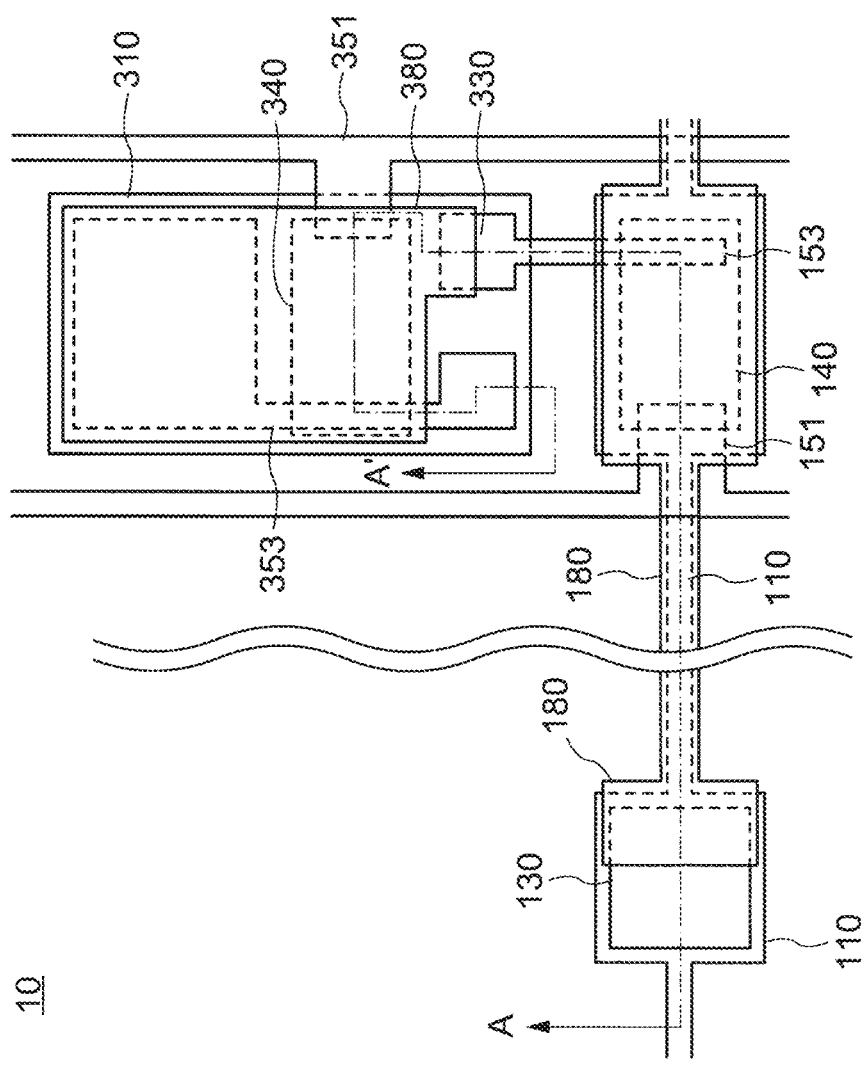
FIG. 5B is a planar view illustrating a method for manufacturing a display device according to an embodiment of the present invention.

Subsequently, the second gate insulating layer 160 is formed as shown in FIG. 5A and FIG. 5B. An oxide semiconductor layer and a conductive layer are deposited on the second gate insulating layer 160, further these layers are etched using a resist mask 189. The second oxide semiconductor layers 170, 370 and the second gate electrodes 180, 380 are formed by the etching. After the etching, the resist mask 189 is removed. The conductive layer mentioned above is deposited to be in contact with the oxide semiconductor layer. As shown in FIG. 5B, the second gate electrode 180 overlaps with the second connection electrode 130 in a planar view. Similarly, in the planar view, the second gate electrode 380 overlaps with the second connection electrode 330 in a planar view.

A film deposition of an oxide semiconductor layer to be the second oxide semiconductor layers 170, 370 (hereinafter, referred to as "film deposition of the second oxide semiconductor layers 170, 370") is performed under a condition in which the ratio of oxygen gas contained in the process gas used in the sputtering is higher compared with a film deposition conditions of the first oxide semiconductor layers 140, 340. In the present embodiment, the second oxide semiconductor layers 170, 370 are crystallized by setting a ratio of the second oxide semiconductor layers 170, 370 to be higher than a ratio of the first oxide semiconductor layers 140, 340 in an oxygen-gas ratio in deposition of the film. Alternatively, when both the first oxide semiconductor layers 140, 340 and the second oxide semiconductor layers 170, 370 show a crystallizability, the second oxide semiconductor layers 170, 370 have a higher crystalline than the first oxide semiconductor layers 140, 340. Due to the difference in the film deposition condition, an oxygen content of the second oxide semiconductor layers 170, 370 are larger than an oxygen content of the first oxide semiconductor layers 140, 340.

By depositing the second oxide semiconductor layers 170, 370 by a sputtering method under conditions in which oxygen gas ratio is higher than that of the first oxide semiconductor layers 140, 340, oxygen is implanted to the second gate insulating layer 160. Oxygen implanted into the second gate insulating layer 160 diffuses towards the outside of the film in a later heat treatment (e.g., heat treatment at about 350° C.). When the oxygen diffused toward the first oxide semiconductor layers 140, 340 by the heat treatment reaches the first oxide semiconductor layers 140, 340, the oxygen from the second gate insulating layer 160 is provided to the first oxide semiconductor layers 140, 340. This oxygen repairs an oxygen deficiency of the first oxide semiconductor layers 140, 340.

Subsequently, as shown in FIG. 6, the first insulating layer 190 is formed. A planar view corresponding to FIG. 6 is the same as FIG. 5B, so it is not shown. The film deposition of the first insulating layer 190 is performed at a temperature at which oxygen is released from the second oxide semiconductor layers 170, 370 which contain an excessive oxygen. Therefore, the oxygen deficiency of the first oxide semiconductor layers 140, 340 are repaired along with the film deposition of the first insulating layer 190 as described above. However, by performing heat treatment prior to or after forming the first insulating layer 190, oxygen may be released from the second oxide semiconductor layer 170.

Figure 7A:
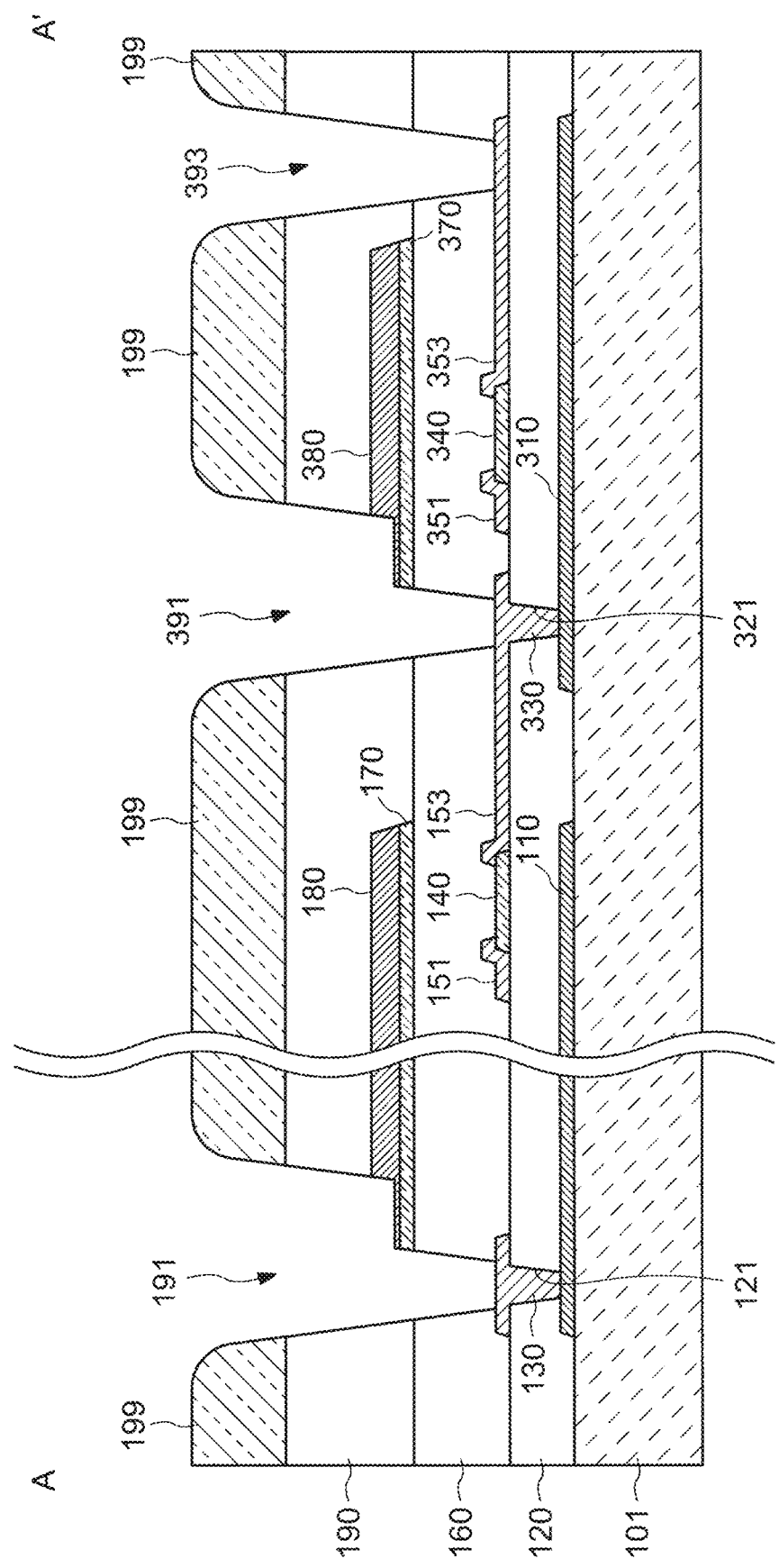
FIG. 7A is a cross-sectional view illustrating a method for manufacturing a display device according to an embodiment of the present invention.
Figure 7B:
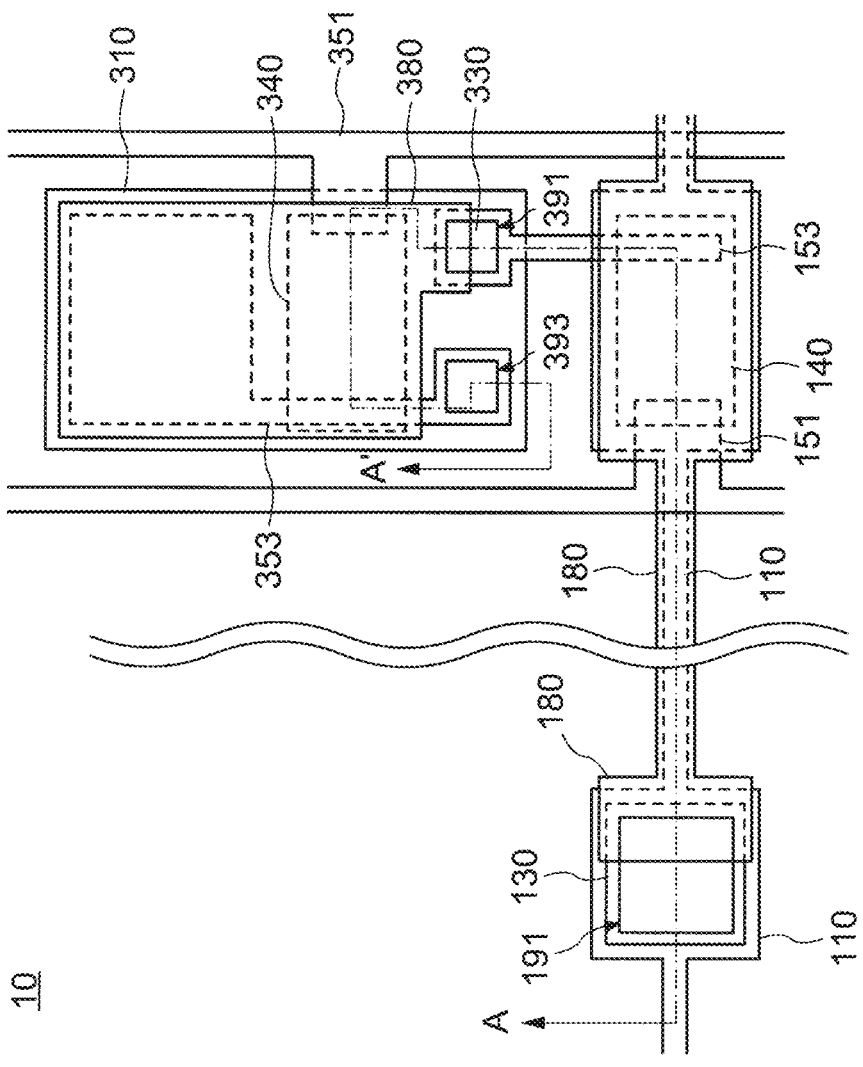
FIG. 7B is a planar view illustrating a method for manufacturing a display device according to an embodiment of the present invention.

Subsequently, as shown in FIG. 7A and FIG. 7B, the first insulating layer 190 and the second gate insulating layer 160 are etched using a resist mask 199. Conditions of this etching is performed in a condition that an etching rate of the first insulating layer 190, the second gate insulating layer 160 and the second gate electrodes 180, 380 is smaller than an etching rate of second oxide semiconductor layers 170, 370. That is, even if the etching proceeds and the second gate electrodes 180, 380 exposed to the surface during the etching are all etched in a film thickness direction, the second oxide semiconductor layers 170, 370 function as an etching stopper. In the present embodiment, the second gate electrodes 180, 380 are not all etched in the film thickness direction, the second oxide semiconductor layers 170, 370 do not yet function as an etching stopper.

By etching the first insulating layer 190 and the second gate insulating layer 160 in the method described above, the first apertures 191, 391 and the third aperture 393 are formed. As shown in FIG. 7B, the first aperture 191 exposes both the second connection electrode 130 and the second gate electrode 180. Similarly, the first aperture 391 exposes both the second connection electrode 330 and the second gate electrode 380. By the etching described above the second gate electrode 180, 380 are thinned be the etching. In other words, a film thickness of the second gate electrodes 180, 380 in a region in which the aperture described above is arranged is smaller than a film thickness of the second gate electrodes 180, 380 in a region in which the aperture is not arranged. After the aperture is formed, the resist mask 199 is removed.

Figure 8:
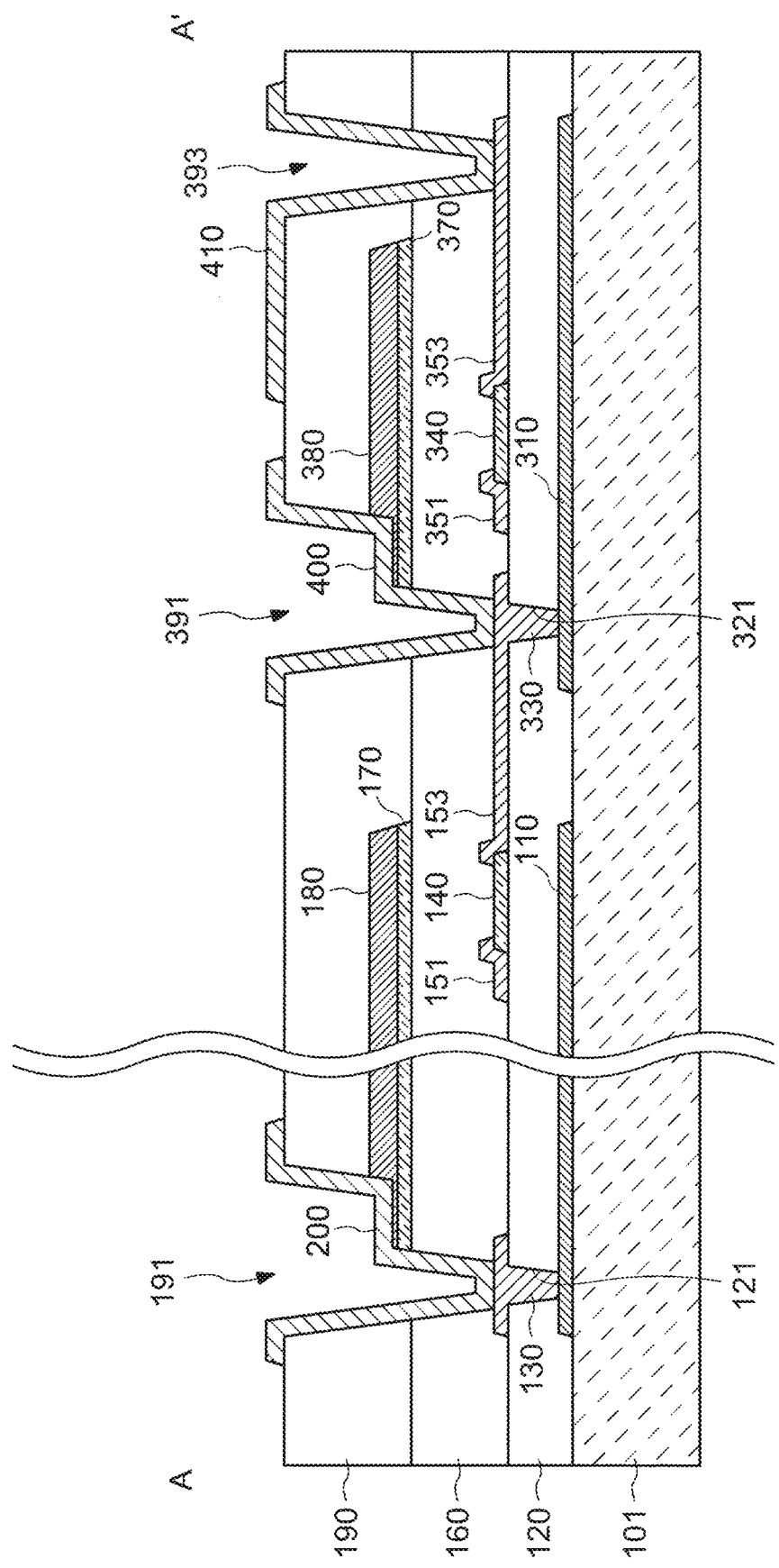
FIG. 8 is a cross-sectional view illustrating a method for manufacturing a display device according to an embodiment of the present invention.

Subsequently, as shown in FIG. 8, a conductive layer is deposited on the first insulating layer 190 and inside of aperture arranged in the first insulating layer 190 as described above, by patterning the conductive layer, the first connection electrodes 200, 400 and the third connection electrode 410 are formed. Subsequently, by forming the second insulating layer 420 (refer FIG. 1A) in which the fourth aperture 421 (refer FIG. 1A) is arranged and forming the pixel electrode 430 (refer FIG. 1A) thereon, the display device 10 shown in FIG. 1A and FIG. 1B is completed.

As described above, in the manufacturing method of the display device 10 according to the present embodiment, in a region where the first aperture 191 overlaps in planar view, the second gate electrode 180 is arranged in contact with the second oxide semiconductor layer 170. Therefore, when the first aperture 191 is formed, even when the second gate electrode 180 in a region corresponding to the first aperture 191 is completely etched in the film thickness direction, the second oxide semiconductor layer 170 functions as a stopper of the etching. When the first connection electrode 200 made of the metal is formed on the second oxide semiconductor layer 170, the oxygen around the surface of the second oxide semiconductor layer 170 is reduced by the first connection electrode 200, and a resistance of the second oxide semiconductor layer 170 is reduced. Similarly, between the second oxide semiconductor layer 170 and the second gate electrode 180, a resistance of the second oxide semiconductor layer 170 is reduced. That is, as described above, even when the second oxide semiconductor layer 170 is exposed from the second gate electrode 180 by etching and the first connection electrode 200 contacts the second oxide semiconductor layer 170, the contact between an upper surface of the second oxide semiconductor layer 170 and the first connection electrode 200 is ensured. In other words, since the first connection electrode 200 and the second oxide semiconductor layer 170 can be brought into contact with each other in a wide area, the contact resistance between both elements can be reduced.

Here, when a metal film is deposited directly on the second gate insulating layer 160, the oxygen is reduced at the surface of the second gate insulating layer 160 being in contact with the metal film deposited thereon. When the oxygen in the second gate insulating layer 160 is reduced, defects occur in the second gate insulating layer 160. When a fixed charge is trapped in the defect, problems such that characteristics of transistor are fluctuated. When the oxygen in the second gate insulating layer 160 is reduced, the oxygen content of the second gate insulating layer 160 is reduced. When the heat treatment is performed in this state, the oxygen of the first oxide semiconductor layer 140, 340 is moved to the second gate insulating layer 160, and oxygen defect is caused in the first oxide semiconductor layer 140, 340.

On the other hand, as mentioned in the present embodiment, it is possible to suppress the oxygen of the second gate insulating layer 160 from reducing by forming the second gate electrode 180 via the second oxide semiconductor layer 170. As a result, it is possible to suppress the occurrence of the problem mentioned above.

Furthermore, in the ratio of oxygen gas in the process gas used in the film deposition, it is possible to supply oxygen to the first oxide semiconductor layers 140, 340 by the heat treatment after forming the second oxide semiconductor layers 170, 370 because the ratio of the second oxide semiconductor layers 170, 370 are higher than the ratio of the first oxide semiconductor layers 140, 340.

In the present embodiment, the configuration in which the second gate electrodes 180, 380 remain on the second oxide semiconductor layers 170, 370 in the first aperture 191 has been exemplified, but is not limited to this configuration. For example, as shown in FIG. 9, the second oxide semiconductor layers 170, 370 may be exposed from the second gate electrodes 180, 380 in the first aperture 191, 391.

Second Embodiment

Referring to FIG. 10A to FIG. 17, an outline of a display device 10A according to a second embodiment of the present invention will be described. The display device 10A differs from the display device 10 in the first embodiment in structures of electrically connecting a first gate electrode 110A, 310A and a second gate electrode 180A, 380A. Although an organic EL display device is described as the display device 10A in this embodiment, similarly to the display device 10, the display device 10A can be used as a display device such as a liquid crystal display device and an electronic paper. A first transistor 100A and the a second transistor 300A used for the display device 10A can be used for a semiconductor device such as MPU.

Figure 10A:
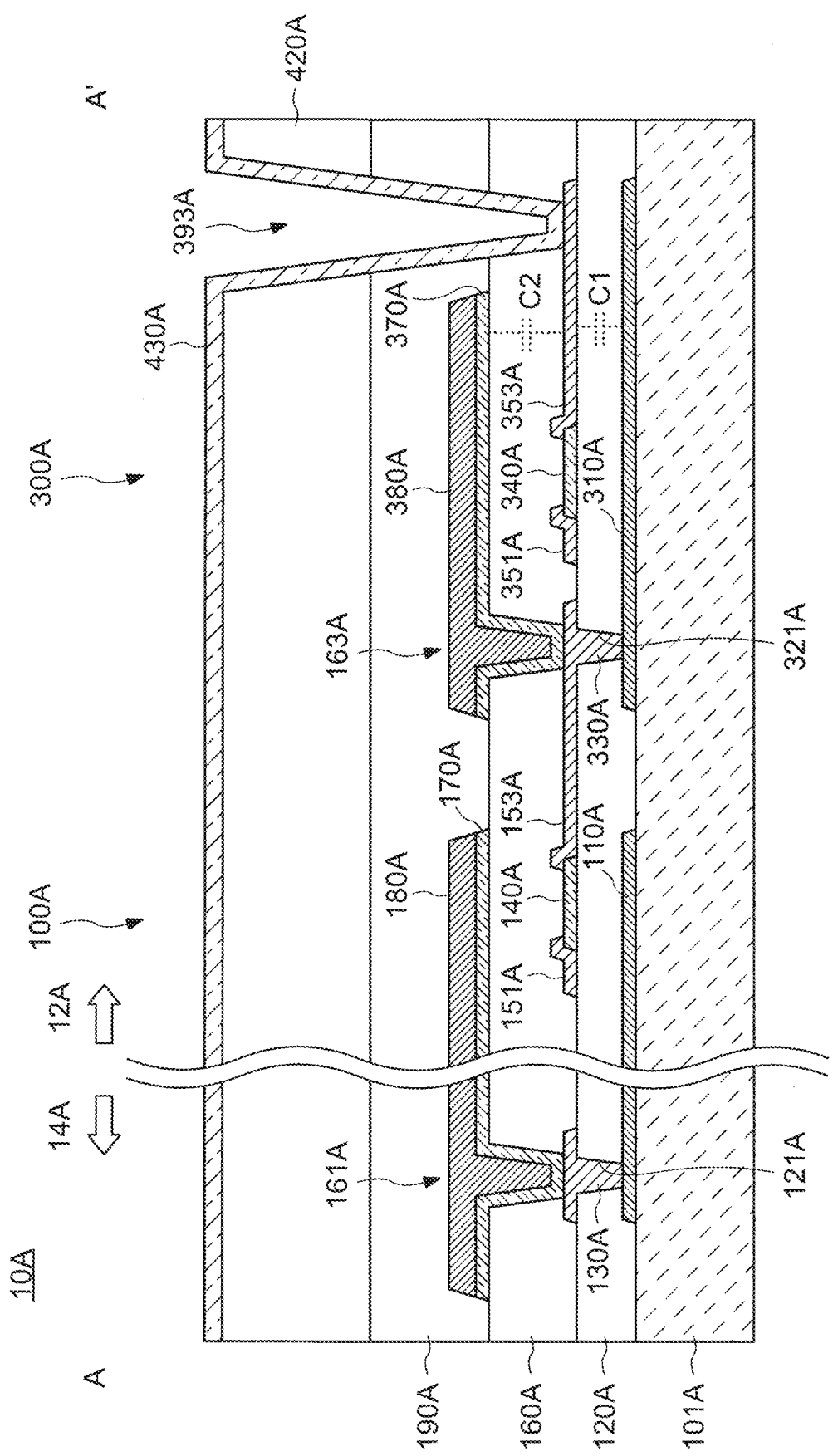
FIG. 10A is a cross-sectional view illustrating an outline of a display device according to an embodiment of the present invention.
Figure 10B:
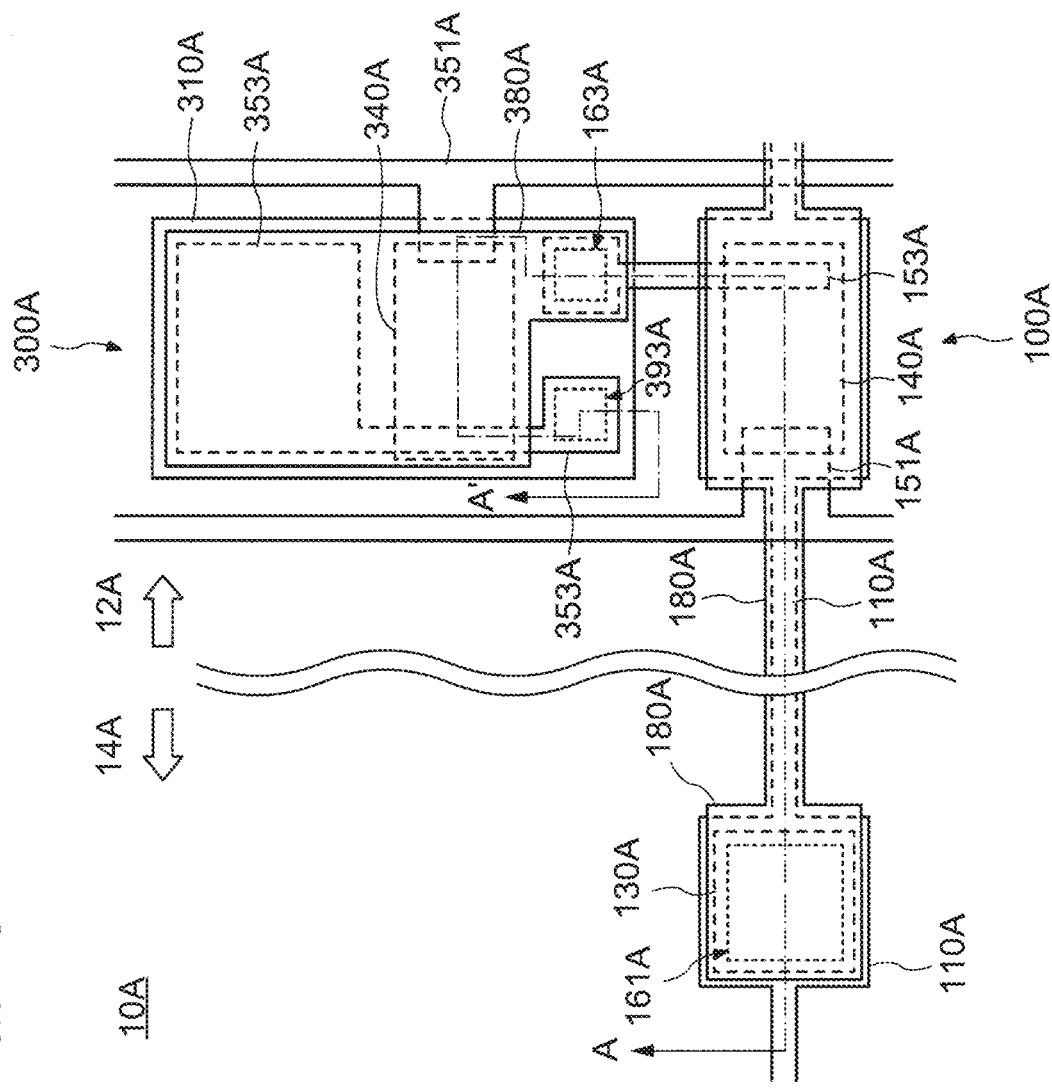
FIG. 10B is a planar view illustrating an outline of a display device according to an embodiment of the present invention.

FIG. 10A is a cross-sectional view illustrating an outline of a display device according to an embodiment of the present invention. FIG. 10B is a planar view illustrating an outline of a display device according to an embodiment of the present invention. FIG. 10A is a cross-sectional view from a line A to A' at planar view of FIG. 10B. As shown in FIG. 10A and FIG. 10B, the display device 10A includes a first transistor 100A and a second transistor 300A. In the present embodiment, description of the same features as those of the first embodiment is omitted, and points different from those of the first embodiment will be described.

Unlike the display device 10, the display device 10A does not include a aperture for electrically connecting the first gate electrode 110A and the second gate electrode 180A, and a aperture for electrically connecting the first gate electrode 310A and the second gate electrode 380A in a first insulating layer 190A. In the display device 10A, a second oxide semiconductor layers 170A, 370A and the second gate electrodes 180A, 380A are arranged in a first apertures 161A, 163A which are arranged in a second gate insulating layer 160A. The first gate electrode 110A and the second gate electrode 180A are electrically connected to each other via a second connection electrode 130A. The first gate electrode 310A and the second gate electrode 380A are electrically connected to each other via a second connection electrode 330A.

As shown in FIG. 10A, the second oxide semiconductor layer 170A is sandwiched between the second connection electrode 130A and the second gate electrode 180A at the bottom of the first aperture 161A. A second oxide semiconductor layer 370A is sandwiched between the second connection electrode 330A and the second gate electrode 380A at the bottom of the first aperture 163A. When the second gate electrodes 180A, 380A made of metal is formed on the second oxide semiconductor layers 170A, 370A, the oxygen of the second oxide semiconductor layers 170A, 370A is reduced by the second gate electrodes 180A, 380A, and the resistance of the second oxide semiconductor layers 170A, 370A is reduced. Therefore, even if the second oxide semiconductor layer 170A is arranged between the second connection electrode 130A and the second gate electrode 180A, and the second oxide semiconductor layer 370A is arranged between the second connection electrode 330A and the second gate electrode 380A, the second connection electrode 130A and the second gate electrode 180A can be electrically connected, and the second connection electrode 330A and the second gate electrode 380A can be electrically connected.

The second oxide semiconductor layers 170A, 370A are also arranged on side walls of the second gate insulating layer 160A in the first apertures 161A, 163A. In other words, the second oxide semiconductor layers 170A, 370A prevent the metallic layer (the second gate electrode 180A, 380A) from contacting the second gate insulating layer 160A at the side wall of the second gate insulating layer 160A in the first apertures 161A, 163A.

In FIG. 10A, the first gate electrode 110A and the second gate electrode 180A are electrically connected to each other via the second connection electrodes 130A, 330A, and the first gate electrode 310A and the second gate electrode 380A are electrically connected to each other, but as described in the first embodiment, the second connection electrodes 130A, 330A may be omitted. If the second connection electrodes 130A, 330A are omitted, the second gate electrodes 180A, 380A and the second oxide semiconductor layers 170A, 370A arranged in the first apertures 161A, 163A can be interpreted as a connection electrode.

A third aperture 393A is arranged in the second gate insulating layer 160A, the first insulating layer 190A, and a second insulating layer 420A. As shown in FIG. 10B, the third aperture 393A overlaps with a drain electrode 353A in a planar view. That is, the third aperture 393A reaches the drain electrode 353A. A pixel electrode 430A is arranged on the second insulating layer 420A and in the third aperture 393A. The pixel electrode 430A is connected to the drain electrode 353A at the bottom of the third aperture 393A.

In a drain electrode 353A side of the second transistor 300A, capacitances are configured by two different insulating layers. The first gate electrode 310A and the drain electrode 353A configure a first capacitance C1 using a first gate insulating layer 120A as a dielectric. The drain electrode 353A and the second gate electrode 380A (or the second gate electrode 380A and the second oxide semiconductor layer 370A) configure a second capacitance C2 having the second gate insulating layer 160A as a dielectric. That is, as shown in FIG. 10B, the first gate electrode 310A and the drain electrode 353A overlap in a planar view. Similarly, the drain electrode 353A and second gate electrode 380A overlap. In other words, the first capacitance C1 and the second capacitance C2 overlap in a planar view.

As described above, according to the display device 10A of the present embodiment, since the second oxide semiconductor layers 170A, 370A are arranged on a side wall of the second gate insulating layer 160A in the first apertures 161A and 163A, it is possible to suppress the oxygen of the second gate insulating layer 160A from being reduced around the side wall as described above and suppress the oxygen defect from being formed in a first oxide semiconductor layers 140A and 340A due to the effect of the reduction. According to the display device 10A, it is not necessary to form the first connection electrodes 200, 400 arranged on the display device 10. As described above, since the display device 10A can suppress the oxygen defect from being formed in the first oxide semiconductor layers 140A, 340A as compared with the display device 10, more stabled transistor characteristics can be obtained. According to the display device 10A, since it is not necessary to arrange the first connection electrodes 200, 400 arranged in the display device 10, it is possible to obtain a display device having a simpler structure. As a result, it is possible to miniaturize the transistor circuit.

It is possible to make size of the area where capacitances are disposed smaller in planar view, by overlapping the first capacitance C1 and the second capacitance C2 in a planar view. As a result, it is possible to miniaturize the transistor circuit.

[Circuitry Configuration of Display Device 10A]

Figure 11:
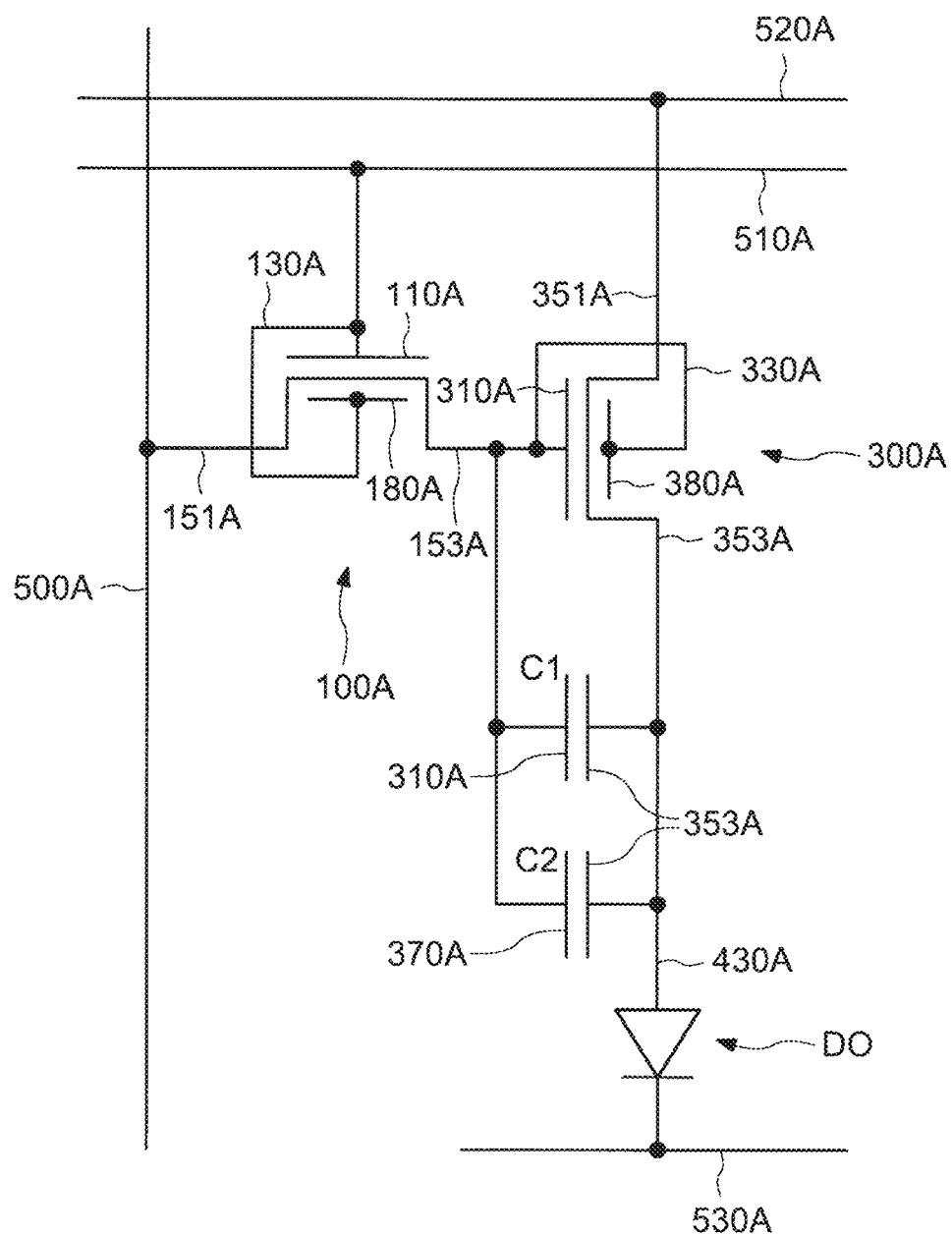
FIG. 11 is a pixel diagram illustrating an outline of a display device according to an embodiment of the present invention.

FIG. 11 is a pixel diagram illustrating an outline of a display device according to an embodiment of the present invention. A pixel circuit of the display device 10A shown in FIG. 11 is similar to the pixel circuit of the display device 10 shown in FIG. 2, but differs from the pixel circuit of the display device 10 in that it does not have the third capacitance C3. In other respects, since both embodiments have the same characteristics, their descriptions are omitted here.

[Manufacturing Method of Display Device 10A]

The manufacturing method of a display device 10A according to the present embodiment will be described with reference to FIG. 12 to FIG. 17. FIG. 12 to FIG. 17 are each a cross-sectional view illustrating a method for manufacturing a display device according to an embodiment of the present invention. In the following description, a detailed description will be omitted where the same manufacturing method as the manufacturing method shown in FIG. 3A to FIG. 8 is used. Since the configuration in a planar view of the display device 10A shown in FIG. 10B is similar to the configuration in a planar view of the display device 10 shown in FIG. 1B, a planar view is not illustrated in the explanation of the manufacturing method of the display device 10A.

Figure 12:
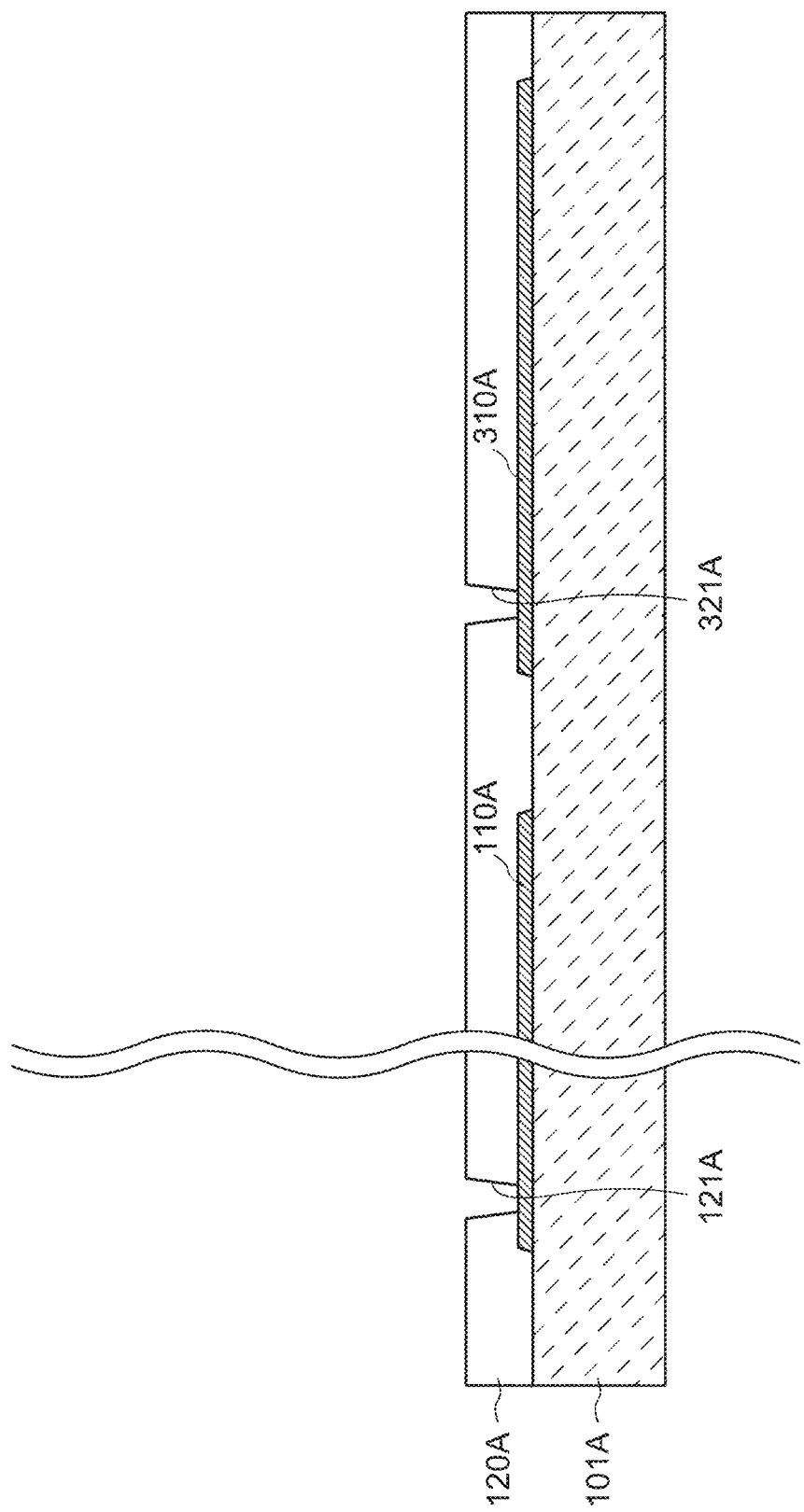
FIG. 12 is a cross-sectional view illustrating a method for manufacturing a display device according to an embodiment of the present invention.

First, as shown in FIG. 12, the first gate electrodes 110A, 310A are formed on the substrate 101A, and then the first gate insulating layer 120A is formed thereon. Then, a second apertures 121A, 321A are formed in the first gate insulating layer 120A to expose the first gate electrodes 110A, 310A.

Figure 13:
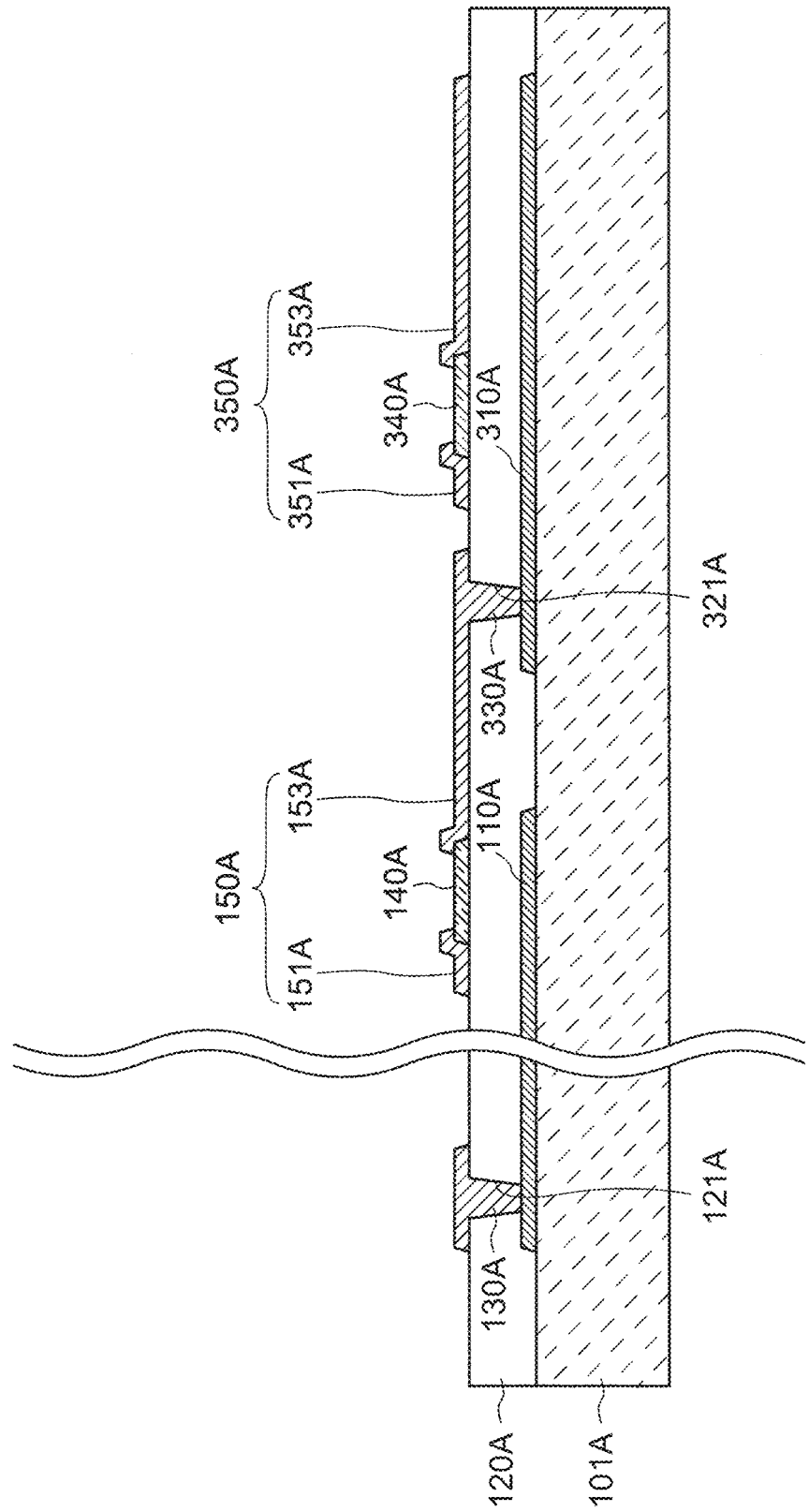
FIG. 13 is a cross-sectional view illustrating a method for manufacturing a display device according to an embodiment of the present invention.

Subsequently, as shown in FIG. 13, a pattern of the first oxide semiconductor layers 140A, 340A are formed on the first gate insulating layer 120A. The second connection electrodes 130A, 330A and SD electrodes 150A, 350A are formed on the first oxide semiconductor layers 140A, 340A.

Figure 14:
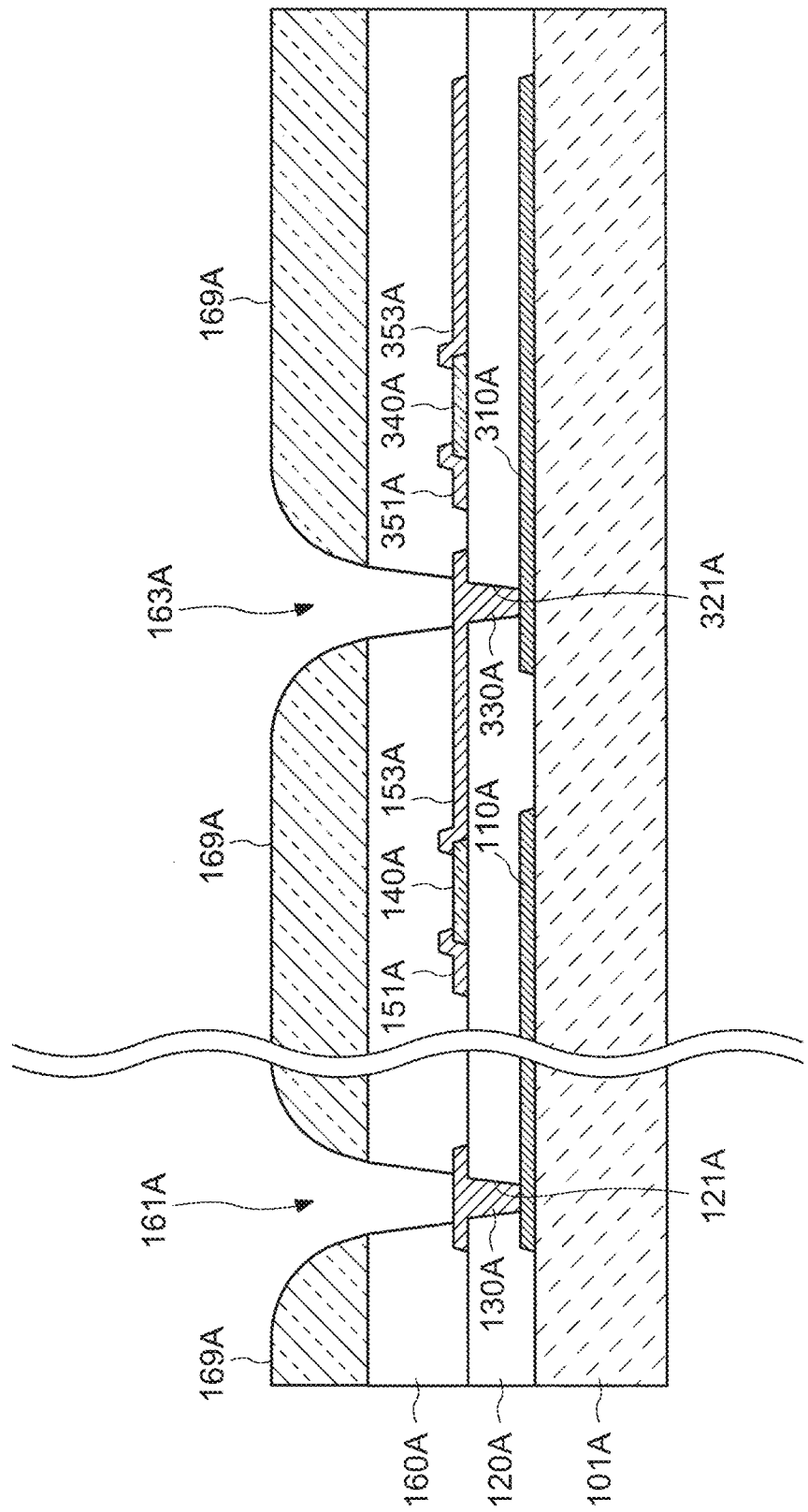
FIG. 14 is a cross-sectional view illustrating a method for manufacturing a display device according to an embodiment of the present invention.

Subsequently, as shown in FIG. 14, the second gate insulating layer 160A is formed on the first oxide semiconductor layers 140A, 340A, the second connection electrodes 130A, 330A, and the SD electrodes 150A, 350A. Then, the second gate insulating layer 160A is etched using a resist mask 169A to form the first apertures 161A, 163A. After the etching is complete, the resist mask 169A is removed.

Figure 15:
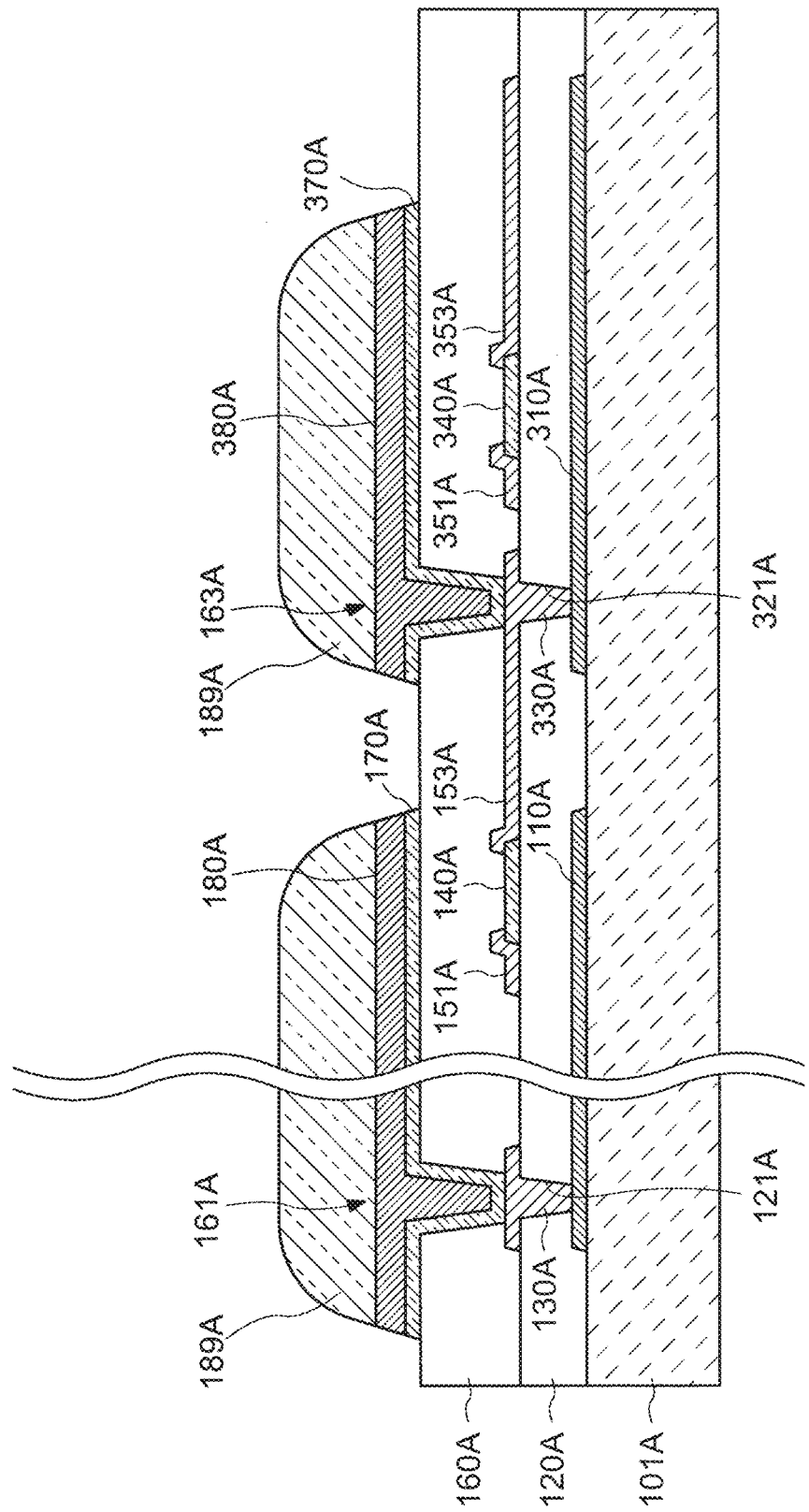
FIG. 15 is a cross-sectional view illustrating a method for manufacturing a display device according to an embodiment of the present invention.

Subsequently, as shown in FIG. 15, the oxide semiconductor layer and the conductive layer are deposited on the second gate insulating layer 160A and in the first apertures 161A, 163A. These layers are etched using the resist mask 189A to form the second oxide semiconductor layers 170A, 370A and the second gate electrodes 180A, 380A. After the etching is complete, the resist mask 189A is removed. In this process, when the oxide semiconductor layer is formed, the surface of the second connection electrode 130 is exposed to an oxygen-atmosphere. Therefore, as an uppermost layer of the second connection electrode 130, it is preferable to use a material which is not insulated even if the material is oxidized. Since the density of the oxide semiconductor layer is higher than the density of the insulating layer such as silicon oxide, oxygen is less likely to diffuse through the oxide semiconductor layer. Therefore, it is preferable that as much oxygen as possible is implanted into the second gate insulating layer 160A at an initial stage of film deposition of the oxide semiconductor layer. That is, it is preferable that a partial pressure of oxygen in the initial stage of film deposition of the oxide semiconductor layer should be higher than a partial pressure of oxygen in the other stages.

Figure 16:
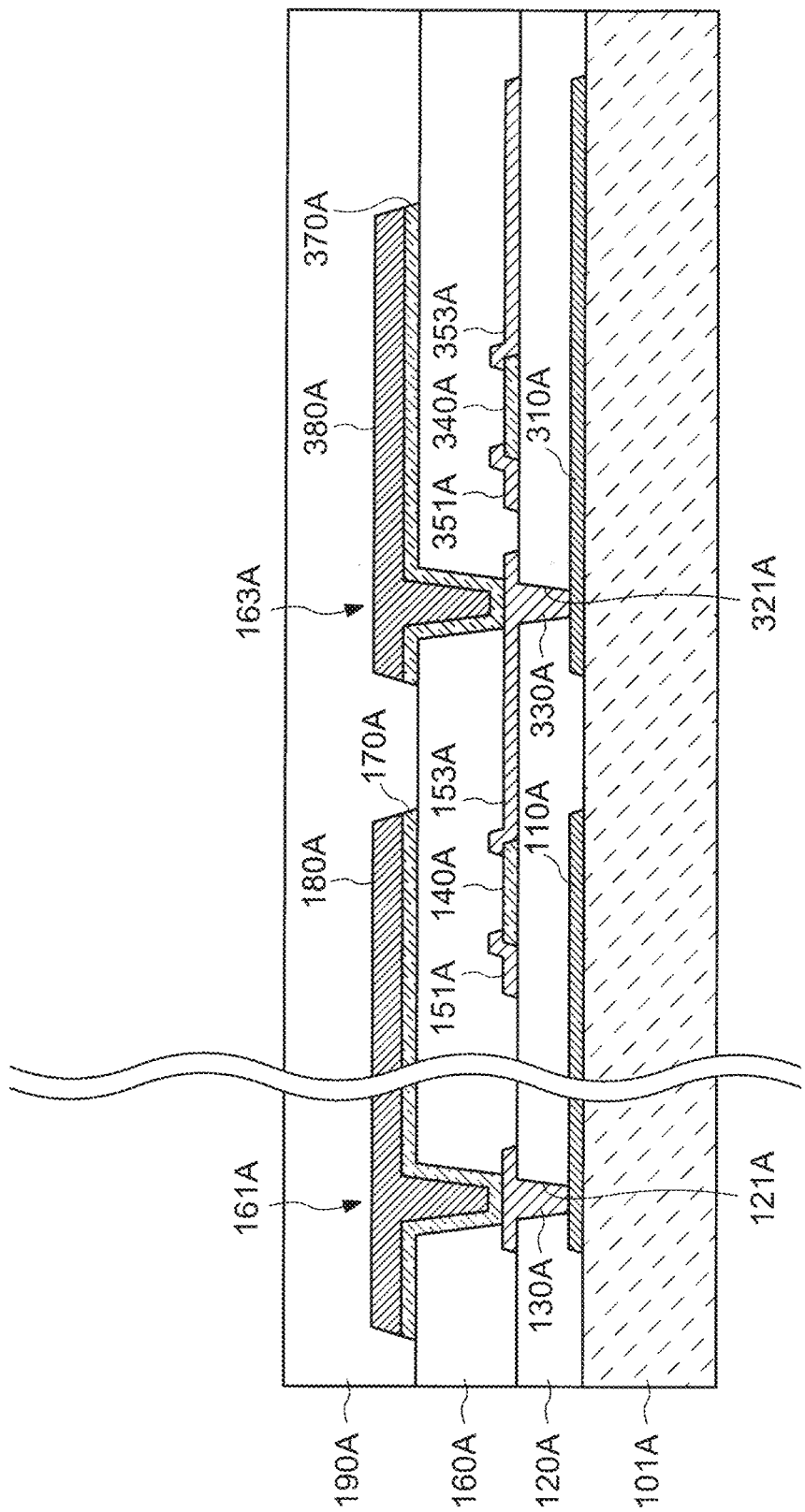
FIG. 16 is a cross-sectional view illustrating a method for manufacturing a display device according to an embodiment of the present invention.

Subsequently, as shown in FIG. 16, the first insulating layer 190A is formed on the second gate electrode 180A, 380A.

Subsequently, as shown in FIG. 17, the second insulating layer 420A is formed on the first insulating layer 190A. The third aperture 393A is formed on the second insulating layer 420A, the first insulating layer 190A, and the second gate insulating layer 160A to expose the drain electrode 353A. Dry etching or wet etching may be used to form the third aperture 393A, and laser beam processing may also be used to form the third aperture 393A. After the third aperture 393A is formed, by forming the pixel electrode 430A on the second insulating layer 420A and in the third aperture 393A, the display device 10A shown in FIG. 10A and FIG. 10B is completed.

As described above, by forming the second gate electrodes 180A, 380A via the second oxide semiconductor layers 170A, 370A, the oxygen of the second gate insulating layer 160A can be suppressed from being reduced, as mentioned in the manufacturing process of the display device 10A according to the present embodiment. Further, it is possible to supply oxygen to the first oxide semiconductor layers 140A, 340A by the heat treatment after forming the second oxide semiconductor layers 170A, 370A because the ratio of the second oxide semiconductor layers 170A, 370A are higher than the ratio of the first oxide semiconductor layers 140A, 340A.

Each of the embodiments described above as an embodiment of the present invention can be appropriately combined and implemented as long as they do not contradict each other. It is also within the scope of the present invention that a person skilled in the art adds, deletes, or changes designs of constituent elements, or adds, omits, or changes conditions of steps as appropriate based on display device of the respective embodiments, as long as the gist of the present invention is provided.

In this specification, the case of an EL display device is mainly exemplified as the disclosed example, but other examples of application include any flat-panel type display device such as other self light emitting type display device, electronic paper type display device having electrophoretic elements and the like. In addition, the present invention can be applied from a medium-sized and small-sized to a large-sized, without any particular limitation.

Even if it is other working effects which differ from the working effect brought about by the mode of each embodiment mentioned above, what is clear from the description in this The description, or what can be easily predicted by the person skilled in the art is naturally understood to be brought about by the present invention.

What is claimed is:

1. A semiconductor device comprising:
   a first gate electrode;
   a first gate insulating layer above the first gate electrode;
   a first oxide semiconductor layer above the first gate insulating layer;
   a source electrode and a drain electrode connected to the first oxide semiconductor layer;
   a second gate insulating layer above the first oxide semiconductor layer;
   a second gate electrode above the second gate insulating layer;
   a first insulating layer above the second gate electrode;
   a second oxide semiconductor layer between the second gate insulating layer and the second gate electrode;
   a first aperture penetrating the first insulating layer and the second gate insulating layer, a part of the first aperture overlapping the second oxide semiconductor layer in a planar view;
   a first connecting electrode in the first aperture;
   a second aperture penetrating the first gate insulating layer; and
   a second connecting electrode in the second aperture, wherein
   the first connecting electrode is connected to the second gate electrode and the second connecting electrode, and
   the second connecting electrode is connected to the first gate electrode.

2. The semiconductor device according to claim 1, wherein the first connecting electrode covers a side surface of the second oxide semiconductor layer in the first aperture.

3. The semiconductor device according to claim 1, wherein the second connecting electrode is in a same layer with the source electrode or the drain electrode.

4. The semiconductor device according to claim 1, wherein
   the second connecting electrode is in contact with a top surface of the first gate insulating layer, and
   the source electrode or the drain electrode is in contact with a top surface of the first gate insulating layer.

5. The semiconductor device according to claim 1, wherein the first connecting electrode is in contact with the second oxide semiconductor layer.

* * * * *